(12) United States Patent
Chou

(10) Patent No.: US 8,650,236 B1
(45) Date of Patent: Feb. 11, 2014

(54) HIGH-RATE INTERPOLATION OR DECIMATION FILTER IN INTEGRATED CIRCUIT DEVICE

(75) Inventor: Shin-I Chou, Hayward, CA (US)

(73) Assignee: Altera Corporation, San Jose, CA (US)

( * ) Notice: Subject to any disclaimer, the term of this patent is extended or adjusted under 35 U.S.C. 154(b) by 1024 days.

(21) Appl. No.: 12/535,133

(22) Filed: Aug. 4, 2009

(51) Int. Cl.
*G06F 17/17* (2006.01)
*G06F 17/10* (2006.01)

(52) U.S. Cl.
USPC .......................................................... 708/313

(58) Field of Classification Search
USPC .......................................................... 708/313
See application file for complete search history.

(56) References Cited

U.S. PATENT DOCUMENTS

| | | | |
|---|---|---|---|
| 3,473,160 A | 10/1969 | Wahlstrom | |
| 3,800,130 A | 3/1974 | Martinson et al. | |
| 3,814,924 A | 6/1974 | Tate | |
| 4,156,927 A | 5/1979 | McElroy et al. | |
| 4,179,746 A | 12/1979 | Tubbs | |
| 4,212,076 A | 7/1980 | Conners | |
| 4,215,406 A | 7/1980 | Gomola et al. | |
| 4,215,407 A | 7/1980 | Gomola et al. | |
| 4,422,155 A | 12/1983 | Amir et al. | |
| 4,484,259 A | 11/1984 | Palmer et al. | |
| 4,521,907 A | 6/1985 | Amir et al. | |
| 4,575,812 A | 3/1986 | Kloker et al. | |
| 4,597,053 A | 6/1986 | Chamberlin | |
| 4,616,330 A | 10/1986 | Betz | |
| 4,623,961 A | 11/1986 | Mackiewicz | |
| 4,682,302 A | 7/1987 | Williams | |
| 4,718,057 A | 1/1988 | Venkitakrishnan et al. | |
| 4,727,508 A | 2/1988 | Williams | |
| 4,736,335 A | 4/1988 | Barkan | |
| 4,754,421 A | 6/1988 | Bosshart | |

(Continued)

FOREIGN PATENT DOCUMENTS

| | | |
|---|---|---|
| EP | 0 158 430 | 10/1985 |
| EP | 0 326 415 | 8/1989 |

(Continued)

OTHER PUBLICATIONS

Altera Corporation, "FIR Compiler: MegaCore® Function User Guide," version 3.3.0, rev. 1, pp. 3 11 through 3 15 (Oct. 2005).

(Continued)

*Primary Examiner* — Henry Tsai
*Assistant Examiner* — Dean Phan
(74) *Attorney, Agent, or Firm* — Ropes & Gray LLP; Jeffrey H. Ingerman

(57) ABSTRACT

On a device having a maximum data rate, an interpolation filter can be configured in stages, with each stage may be broken into subfilters, which divides the output into phases. The ratio of the number of subfilters or phases in the final stage to the number of subfilters or phases in the initial stage is equal to the factor by which the data rate would otherwise increase. Thus for an interpolation factor of M, the output data rate can be kept the same as the input data rate by providing M subfilters, yielding M output phases each having an output rate equal to the input rate. The effective, or synthesized, output rate is M times the input rate. A decimation filter can be provided in the same way, with the effective input rate M times the output rate, even where the effective input rate would exceed the maximum data rate.

17 Claims, 8 Drawing Sheets

(56) References Cited

U.S. PATENT DOCUMENTS

| | | | |
|---|---|---|---|
| 4,791,590 A | 12/1988 | Ku et al. |
| 4,799,004 A | 1/1989 | Mori |
| 4,823,295 A | 4/1989 | Mader |
| 4,839,847 A | 6/1989 | Laprade |
| 4,871,930 A | 10/1989 | Wong et al. |
| 4,912,345 A | 3/1990 | Steele et al. |
| 4,918,637 A | 4/1990 | Morton |
| 4,967,160 A | 10/1990 | Quievy et al. |
| 4,982,354 A | 1/1991 | Takeuchi et al. |
| 4,991,010 A | 2/1991 | Hailey et al. |
| 4,994,997 A | 2/1991 | Martin et al. |
| 5,068,813 A * | 11/1991 | Thoen ................. 702/197 |
| 5,073,863 A | 12/1991 | Zhang |
| 5,081,604 A | 1/1992 | Tanaka |
| 5,122,685 A | 6/1992 | Chan et al. |
| 5,128,559 A | 7/1992 | Steele |
| 5,175,702 A | 12/1992 | Beraud et al. |
| 5,208,491 A | 5/1993 | Ebeling et al. |
| RE34,363 E | 8/1993 | Freeman |
| 5,267,187 A | 11/1993 | Hsieh et al. |
| 5,296,759 A | 3/1994 | Sutherland et al. |
| 5,338,983 A | 8/1994 | Agarwala |
| 5,339,263 A | 8/1994 | White |
| 5,349,250 A | 9/1994 | New |
| 5,357,152 A | 10/1994 | Jennings, III et al. |
| 5,371,422 A | 12/1994 | Patel et al. |
| 5,375,079 A | 12/1994 | Uramoto et al. |
| 5,381,357 A | 1/1995 | Wedgwood et al. |
| 5,404,324 A | 4/1995 | Colon-Benet |
| 5,416,799 A | 5/1995 | Currivan et al. |
| 5,424,589 A | 6/1995 | Dobbelaere et al. |
| 5,446,651 A | 8/1995 | Moyse et al. |
| 5,451,948 A | 9/1995 | Jekel |
| 5,452,231 A | 9/1995 | Butts et al. |
| 5,452,375 A | 9/1995 | Rousseau et al. |
| 5,457,644 A | 10/1995 | McCollum |
| 5,465,226 A | 11/1995 | Goto |
| 5,465,375 A | 11/1995 | Thepaut et al. |
| 5,483,178 A | 1/1996 | Costello et al. |
| 5,497,498 A | 3/1996 | Taylor |
| 5,500,812 A | 3/1996 | Saishi et al. |
| 5,500,828 A | 3/1996 | Doddington et al. |
| 5,523,963 A | 6/1996 | Hsieh et al. |
| 5,528,550 A | 6/1996 | Pawate et al. |
| 5,537,601 A | 7/1996 | Kimura et al. |
| 5,541,864 A | 7/1996 | Van Bavel et al. |
| 5,546,018 A | 8/1996 | New et al. |
| 5,550,993 A | 8/1996 | Ehlig et al. |
| 5,559,450 A | 9/1996 | Ngai et al. |
| 5,563,526 A | 10/1996 | Hastings et al. |
| 5,563,819 A | 10/1996 | Nelson |
| 5,570,039 A | 10/1996 | Oswald et al. |
| 5,570,040 A | 10/1996 | Lytle et al. |
| 5,572,148 A | 11/1996 | Lytle et al. |
| 5,581,501 A | 12/1996 | Sansbury et al. |
| 5,590,350 A | 12/1996 | Guttag et al. |
| 5,594,366 A | 1/1997 | Khong et al. |
| 5,594,912 A | 1/1997 | Brueckmann et al. |
| 5,596,763 A | 1/1997 | Guttag et al. |
| 5,606,266 A | 2/1997 | Pedersen |
| 5,617,058 A | 4/1997 | Adrian et al. |
| 5,623,377 A | 4/1997 | Behrens et al. |
| 5,631,848 A | 5/1997 | Laczko et al. |
| 5,633,601 A | 5/1997 | Nagaraj |
| 5,636,150 A | 6/1997 | Okamoto |
| 5,636,368 A | 6/1997 | Harrison et al. |
| 5,640,578 A | 6/1997 | Balmer et al. |
| 5,644,519 A | 7/1997 | Yatim |
| 5,644,522 A | 7/1997 | Moyse et al. |
| 5,646,545 A | 7/1997 | Trimberger et al. |
| 5,646,875 A | 7/1997 | Taborn et al. |
| 5,648,732 A | 7/1997 | Duncan |
| 5,652,903 A | 7/1997 | Weng et al. |
| 5,655,069 A | 8/1997 | Ogawara et al. |
| 5,664,192 A | 9/1997 | Lloyd et al. |
| 5,689,195 A | 11/1997 | Cliff et al. |
| 5,696,708 A | 12/1997 | Leung |
| 5,729,495 A | 3/1998 | Madurawe |
| 5,740,404 A | 4/1998 | Baji |
| 5,744,980 A | 4/1998 | McGowan et al. |
| 5,744,991 A | 4/1998 | Jefferson et al. |
| 5,754,459 A | 5/1998 | Telikepalli |
| 5,761,483 A | 6/1998 | Trimberger |
| 5,764,555 A | 6/1998 | McPherson et al. |
| 5,768,613 A | 6/1998 | Asghar |
| 5,771,186 A | 6/1998 | Kodali et al. |
| 5,777,912 A | 7/1998 | Leung et al. |
| 5,784,636 A | 7/1998 | Rupp |
| 5,790,446 A | 8/1998 | Yu et al. |
| 5,794,067 A | 8/1998 | Kadowaki |
| 5,801,546 A | 9/1998 | Pierce et al. |
| 5,805,477 A | 9/1998 | Perner |
| 5,805,913 A | 9/1998 | Guttag et al. |
| 5,808,926 A | 9/1998 | Gorshtein et al. |
| 5,812,479 A | 9/1998 | Cliff et al. |
| 5,812,562 A | 9/1998 | Baeg |
| 5,815,422 A | 9/1998 | Dockser |
| 5,821,776 A | 10/1998 | McGowan |
| 5,825,202 A | 10/1998 | Tavana et al. |
| 5,838,165 A | 11/1998 | Chatter |
| 5,841,684 A | 11/1998 | Dockser |
| 5,847,579 A | 12/1998 | Trimberger |
| 5,847,978 A | 12/1998 | Ogura et al. |
| 5,847,981 A | 12/1998 | Kelley et al. |
| 5,859,878 A | 1/1999 | Phillips et al. |
| 5,869,979 A | 2/1999 | Bocchino |
| 5,872,380 A | 2/1999 | Rostoker et al. |
| 5,874,834 A | 2/1999 | New |
| 5,878,250 A | 3/1999 | LeBlanc |
| 5,880,981 A | 3/1999 | Kojima et al. |
| 5,892,962 A | 4/1999 | Cloutier |
| 5,894,228 A | 4/1999 | Reddy et al. |
| 5,898,602 A | 4/1999 | Rothman et al. |
| 5,931,898 A | 8/1999 | Khoury |
| 5,935,197 A | 8/1999 | Aldworth |
| 5,942,914 A | 8/1999 | Reddy et al. |
| 5,944,774 A | 8/1999 | Dent |
| 5,949,710 A | 9/1999 | Pass et al. |
| 5,951,673 A | 9/1999 | Miyata |
| 5,956,265 A | 9/1999 | Lewis |
| 5,959,871 A | 9/1999 | Pierzchala et al. |
| 5,960,193 A | 9/1999 | Guttag et al. |
| 5,961,635 A | 10/1999 | Guttag et al. |
| 5,963,048 A | 10/1999 | Harrison et al. |
| 5,963,050 A | 10/1999 | Young et al. |
| 5,968,196 A | 10/1999 | Ramamurthy et al. |
| 5,970,254 A | 10/1999 | Cooke et al. |
| 5,978,260 A | 11/1999 | Trimberger et al. |
| 5,982,195 A | 11/1999 | Cliff et al. |
| 5,986,465 A | 11/1999 | Mendel |
| 5,991,788 A | 11/1999 | Mintzer |
| 5,991,898 A | 11/1999 | Rajski et al. |
| 5,995,748 A | 11/1999 | Guttag et al. |
| 5,999,015 A | 12/1999 | Cliff et al. |
| 5,999,990 A | 12/1999 | Sharrit et al. |
| 6,005,806 A | 12/1999 | Madurawe et al. |
| 6,006,321 A | 12/1999 | Abbott |
| 6,009,451 A | 12/1999 | Burns |
| 6,018,755 A | 1/2000 | Gonikberg et al. |
| 6,020,759 A | 2/2000 | Heile |
| 6,021,423 A | 2/2000 | Nag et al. |
| 6,029,187 A | 2/2000 | Verbauwhede |
| 6,031,763 A | 2/2000 | Sansbury |
| 6,041,339 A | 3/2000 | Yu et al. |
| 6,041,340 A | 3/2000 | Mintzer |
| 6,052,327 A | 4/2000 | Reddy et al. |
| 6,052,755 A | 4/2000 | Terrill et al. |
| 6,055,555 A | 4/2000 | Boswell et al. |
| 6,064,614 A | 5/2000 | Khoury |
| 6,065,131 A | 5/2000 | Andrews et al. |
| 6,066,960 A | 5/2000 | Pedersen |
| 6,069,487 A | 5/2000 | Lane et al. |
| 6,072,994 A | 6/2000 | Phillips et al. |
| 6,073,154 A | 6/2000 | Dick |

(56) References Cited

U.S. PATENT DOCUMENTS

| | | |
|---|---|---|
| 6,075,381 A | 6/2000 | LaBerge |
| 6,084,429 A | 7/2000 | Trimberger |
| 6,085,317 A | 7/2000 | Smith |
| 6,091,261 A | 7/2000 | DeLange |
| 6,091,765 A | 7/2000 | Pietzold, III et al. |
| 6,094,726 A | 7/2000 | Gonion et al. |
| 6,097,988 A | 8/2000 | Tobias |
| 6,098,163 A | 8/2000 | Guttag et al. |
| 6,107,820 A | 8/2000 | Jefferson et al. |
| 6,107,821 A | 8/2000 | Kelem et al. |
| 6,107,824 A | 8/2000 | Reddy et al. |
| 6,130,554 A | 10/2000 | Kolze et al. |
| 6,140,839 A | 10/2000 | Kaviani et al. |
| 6,144,980 A | 11/2000 | Oberman |
| 6,154,049 A | 11/2000 | New |
| 6,157,210 A | 12/2000 | Zaveri et al. |
| 6,163,788 A | 12/2000 | Chen et al. |
| 6,167,415 A | 12/2000 | Fischer et al. |
| 6,175,849 B1 | 1/2001 | Smith |
| 6,215,326 B1 | 4/2001 | Jefferson et al. |
| 6,226,735 B1 | 5/2001 | Mirsky |
| 6,242,947 B1 | 6/2001 | Trimberger |
| 6,243,729 B1 | 6/2001 | Staszewski |
| 6,246,258 B1 | 6/2001 | Lesea |
| 6,260,053 B1 | 7/2001 | Maulik et al. |
| 6,279,021 B1 | 8/2001 | Takano et al. |
| 6,286,024 B1 | 9/2001 | Yano et al. |
| 6,314,442 B1 | 11/2001 | Suzuki |
| 6,314,551 B1 | 11/2001 | Borland |
| 6,321,246 B1 | 11/2001 | Page et al. |
| 6,323,680 B1 | 11/2001 | Pedersen et al. |
| 6,327,605 B2 | 12/2001 | Arakawa et al. |
| 6,351,142 B1 | 2/2002 | Abbott |
| 6,353,843 B1 | 3/2002 | Chehrazi et al. |
| 6,359,468 B1 | 3/2002 | Park et al. |
| 6,360,240 B1 | 3/2002 | Takano et al. |
| 6,362,650 B1 | 3/2002 | New et al. |
| 6,366,944 B1 | 4/2002 | Hossain et al. |
| 6,367,003 B1 | 4/2002 | Davis |
| 6,369,610 B1 | 4/2002 | Cheung et al. |
| 6,377,970 B1 | 4/2002 | Abdallah et al. |
| 6,407,576 B1 | 6/2002 | Ngai et al. |
| 6,407,694 B1 | 6/2002 | Cox et al. |
| 6,427,157 B1 | 7/2002 | Webb |
| 6,434,587 B1 | 8/2002 | Liao et al. |
| 6,438,569 B1 | 8/2002 | Abbott |
| 6,438,570 B1 | 8/2002 | Miller |
| 6,446,107 B1 | 9/2002 | Knowles |
| 6,453,382 B1 | 9/2002 | Heile |
| 6,467,017 B1 | 10/2002 | Ngai et al. |
| 6,480,980 B2 | 11/2002 | Koe |
| 6,483,343 B1 | 11/2002 | Faith et al. |
| 6,487,575 B1 | 11/2002 | Oberman |
| 6,523,055 B1 | 2/2003 | Yu et al. |
| 6,523,057 B1 | 2/2003 | Savo et al. |
| 6,531,888 B2 | 3/2003 | Abbott |
| 6,538,470 B1 | 3/2003 | Langhammer et al. |
| 6,542,000 B1 | 4/2003 | Black et al. |
| 6,556,044 B2 | 4/2003 | Langhammer et al. |
| 6,557,092 B1 | 4/2003 | Callen |
| 6,571,268 B1 | 5/2003 | Giacalone et al. |
| 6,573,749 B2 | 6/2003 | New et al. |
| 6,574,762 B1 | 6/2003 | Karimi et al. |
| 6,591,283 B1 | 7/2003 | Conway et al. |
| 6,591,357 B2 | 7/2003 | Mirsky |
| 6,600,495 B1 | 7/2003 | Boland et al. |
| 6,600,788 B1 | 7/2003 | Dick et al. |
| 6,628,140 B2 | 9/2003 | Langhammer et al. |
| 6,687,722 B1 | 2/2004 | Larsson et al. |
| 6,692,534 B1 | 2/2004 | Wang et al. |
| 6,700,581 B2 | 3/2004 | Baldwin et al. |
| 6,725,441 B1 | 4/2004 | Keller et al. |
| 6,728,901 B1 | 4/2004 | Rajski et al. |
| 6,731,133 B1 | 5/2004 | Feng et al. |
| 6,732,134 B1 | 5/2004 | Rosenberg et al. |
| 6,744,278 B1 | 6/2004 | Liu et al. |
| 6,745,254 B2 | 6/2004 | Boggs et al. |
| 6,763,367 B2 | 7/2004 | Kwon et al. |
| 6,771,094 B1 | 8/2004 | Langhammer et al. |
| 6,774,669 B1 | 8/2004 | Liu et al. |
| 6,781,408 B1 | 8/2004 | Langhammer |
| 6,781,410 B2 | 8/2004 | Pani et al. |
| 6,788,104 B2 | 9/2004 | Singh et al. |
| 6,801,924 B1 | 10/2004 | Green et al. |
| 6,806,733 B1 | 10/2004 | Pan et al. |
| 6,836,839 B2 | 12/2004 | Master et al. |
| 6,874,079 B2 | 3/2005 | Hogenauer |
| 6,889,238 B2 | 5/2005 | Johnson |
| 6,904,471 B2 | 6/2005 | Boggs et al. |
| 6,917,955 B1 | 7/2005 | Botchev |
| 6,924,663 B2 | 8/2005 | Masui et al. |
| 6,959,316 B2 | 10/2005 | Parviainen |
| 6,963,890 B2 | 11/2005 | Dutta et al. |
| 6,971,083 B1 | 11/2005 | Farrugia et al. |
| 6,978,287 B1 | 12/2005 | Langhammer |
| 6,983,300 B2 | 1/2006 | Ferroussat |
| 7,020,673 B2 | 3/2006 | Ozawa |
| 7,047,272 B2 | 5/2006 | Giacalone et al. |
| 7,062,526 B1 | 6/2006 | Hoyle |
| 7,093,204 B2 | 8/2006 | Oktem et al. |
| 7,107,305 B2 | 9/2006 | Deng et al. |
| 7,113,969 B1 | 9/2006 | Green et al. |
| 7,181,484 B2 | 2/2007 | Stribaek et al. |
| 7,313,585 B2 | 12/2007 | Winterrowd |
| 7,395,298 B2 | 7/2008 | Debes et al. |
| 7,401,109 B2 | 7/2008 | Koc et al. |
| 7,409,417 B2 | 8/2008 | Lou |
| 7,415,542 B2 | 8/2008 | Hennedy et al. |
| 7,421,465 B1 | 9/2008 | Rarick et al. |
| 7,428,565 B2 | 9/2008 | Fujimori |
| 7,428,566 B2 | 9/2008 | Siu et al. |
| 7,430,578 B2 | 9/2008 | Debes et al. |
| 7,430,656 B2 | 9/2008 | Sperber et al. |
| 7,447,310 B2 | 11/2008 | Koc et al. |
| 7,472,155 B2 | 12/2008 | Simkins et al. |
| 7,508,936 B2 | 3/2009 | Eberle et al. |
| 7,519,646 B2 | 4/2009 | Kaul et al. |
| 7,536,430 B2 | 5/2009 | Guevokian et al. |
| 7,567,997 B2 | 7/2009 | Simkins et al. |
| 7,587,443 B1 | 9/2009 | Langhammer |
| 7,590,676 B1 | 9/2009 | Langhammer |
| 7,646,430 B2 | 1/2010 | Brown Elliott et al. |
| 7,668,896 B2 | 2/2010 | Lutz et al. |
| 7,719,446 B2 | 5/2010 | Rosenthal et al. |
| 7,769,797 B2 | 8/2010 | Cho et al. |
| 7,822,799 B1 | 10/2010 | Langhammer et al. |
| 7,836,117 B1 | 11/2010 | Langhammer et al. |
| 7,930,335 B2 | 4/2011 | Gura |
| 7,930,336 B2 | 4/2011 | Langhammer |
| 8,041,759 B1 | 10/2011 | Langhammer et al. |
| 2001/0023425 A1 | 9/2001 | Oberman et al. |
| 2001/0029515 A1 | 10/2001 | Mirsky |
| 2001/0037351 A1* | 11/2001 | Hellberg ............... 708/313 |
| 2001/0037352 A1 | 11/2001 | Hong |
| 2002/0002573 A1 | 1/2002 | Landers et al. |
| 2002/0038324 A1 | 3/2002 | Page et al. |
| 2002/0049798 A1 | 4/2002 | Wang et al. |
| 2002/0078114 A1 | 6/2002 | Wang et al. |
| 2002/0089348 A1 | 7/2002 | Langhammer |
| 2002/0116434 A1 | 8/2002 | Nancekievill |
| 2003/0088757 A1 | 5/2003 | Lindner et al. |
| 2004/0064770 A1 | 4/2004 | Xin |
| 2004/0078403 A1* | 4/2004 | Scheuermann et al. ...... 708/322 |
| 2004/0083412 A1 | 4/2004 | Corbin et al. |
| 2004/0103133 A1 | 5/2004 | Gurney |
| 2004/0122882 A1 | 6/2004 | Zakharov et al. |
| 2004/0148321 A1 | 7/2004 | Guevorkian et al. |
| 2004/0172439 A1 | 9/2004 | Lin |
| 2004/0178818 A1 | 9/2004 | Crotty et al. |
| 2004/0193981 A1 | 9/2004 | Clark et al. |
| 2004/0267857 A1 | 12/2004 | Abel et al. |
| 2004/0267863 A1 | 12/2004 | Bhushan et al. |
| 2005/0038842 A1 | 2/2005 | Stoye |
| 2005/0144212 A1 | 6/2005 | Simkins et al. |

(56) References Cited

U.S. PATENT DOCUMENTS

| | | |
|---|---|---|
| 2005/0144215 A1 | 6/2005 | Simkins et al. |
| 2005/0144216 A1 | 6/2005 | Simkins et al. |
| 2005/0166038 A1 | 7/2005 | Wang et al. |
| 2005/0187997 A1 | 8/2005 | Zheng et al. |
| 2005/0187999 A1 | 8/2005 | Zheng et al. |
| 2005/0262175 A1 | 11/2005 | Iino et al. |
| 2006/0020655 A1 | 1/2006 | Lin |
| 2007/0083585 A1 | 4/2007 | St. Denis et al. |
| 2007/0185951 A1 | 8/2007 | Lee et al. |
| 2007/0185952 A1 | 8/2007 | Langhammer et al. |
| 2007/0241773 A1 | 10/2007 | Hutchings et al. |
| 2008/0133627 A1 | 6/2008 | Langhammer et al. |
| 2008/0183783 A1 | 7/2008 | Tubbs |
| 2009/0172052 A1 | 7/2009 | DeLaquil et al. |
| 2009/0187615 A1 | 7/2009 | Abe et al. |
| 2009/0300088 A1 | 12/2009 | Michaels et al. |
| 2010/0098189 A1 | 4/2010 | Oketani |

FOREIGN PATENT DOCUMENTS

| | | |
|---|---|---|
| EP | 0 380 456 | 8/1990 |
| EP | 0 411 491 | 2/1991 |
| EP | 0 461 798 | 12/1991 |
| EP | 0 498 066 | 8/1992 |
| EP | 0 555 092 | 8/1993 |
| EP | 0 606 653 | 7/1994 |
| EP | 0 657 803 | 6/1995 |
| EP | 0 660 227 | 6/1995 |
| EP | 0 668 659 | 8/1995 |
| EP | 0 721 159 | 7/1996 |
| EP | 0 905 906 | 3/1999 |
| EP | 0 909 028 | 4/1999 |
| EP | 0 927 393 | 7/1999 |
| EP | 0 992 885 | 4/2000 |
| EP | 1 031 934 | 8/2000 |
| EP | 1 049 025 | 11/2000 |
| EP | 1 058 185 | 12/2000 |
| EP | 1 220 108 | 7/2002 |
| GB | 2 283 602 | 5/1995 |
| GB | 2 286 737 | 8/1995 |
| GB | 2 318 198 | 4/1998 |
| JP | 61-237133 | 10/1986 |
| JP | 63-216131 | 8/1988 |
| JP | 4-068709 | 3/1992 |
| JP | 4-332036 | 11/1992 |
| JP | 5-134851 | 6/1993 |
| JP | 06-187129 | 7/1994 |
| JP | 7-135447 | 5/1995 |
| JP | 9-327000 | 12/1997 |
| JP | 11-296345 | 10/1999 |
| JP | 2000-259394 | 9/2000 |
| JP | 2002-108606 | 4/2002 |
| JP | 2002-251281 | 9/2002 |
| WO | WO95/27243 | 10/1995 |
| WO | WO96/28774 | 9/1996 |
| WO | WO97/08606 | 3/1997 |
| WO | WO98/12629 | 3/1998 |
| WO | WO98/32071 | 7/1998 |
| WO | WO98/38741 | 9/1998 |
| WO | WO99/22292 | 5/1999 |
| WO | WO99/31574 | 6/1999 |
| WO | WO99/56394 | 11/1999 |
| WO | WO00/51239 | 8/2000 |
| WO | WO00/52824 | 9/2000 |
| WO | WO01/13562 | 2/2001 |
| WO | WO 2005/066832 | 7/2005 |
| WO | WO2005/101190 | 10/2005 |
| WO | WO 2010/102007 | 9/2010 |

OTHER PUBLICATIONS

Govindu, G. et al., "A Library of Parameterizable Floating-Point Cores for FPGAs and Their Application to Scientific Computing," *Proc Int'l Conf. Eng. Reconfigurable Systems and Algorithms (ERSA '05)* Jun. 2005.

Govindu, G. et al., "Analysis of High-performance Floating-point Arithmetic on FPGAs," *Proceedings of the 18th International Parallel and Distributed Processing Symposium (PDPS'04)*, pp. 149-156, Apr. 2004.

Nakasato, N., et al., "Acceleration of Hydrosynamical Simulations using a FPGA board", *The Institute of Electronics Information and Communication Technical Report CPSY2005-47*, vol. 105, No. 515, Jan. 17, 2006.

Osana, Y., et al., "Hardware-resource Utilization Analysis on an FPGA-Based Biochemical Simulator ReCSiP", *The Institute of Electronics Information and Communication Technical Report CPSY2005-63*, vol. 105, No. 516, Jan. 18, 2006.

Vladimirova, T. et al., "Floating-Point Mathematical Co-Processor for a Single-Chip On-Board Computer," *MAPLD '03 Conference*, D5, Sep. 2003.

Altera Corporation, "Digital Signal Processing (DSP)," *Stratix Device Handbook*, vol. 2, Chapter 6 and Chapter 7, v1.1 (Sep. 2004).

Altera Corporation, "DSP Blocks in Stratix II and Stratix II GX Devices" *Stratix II Device Handbook*, vol. 2, Chapter 6, v4.0 (Oct. 2005).

Underwood, K. "FPGAs vs. CPUs: Trends in Peak Floating-Point Performance," *Proceedings of the 2004 ACM/SIGDA 12th International Symposium on Field Programmable Gate Arrays*, pp. 171-180, Feb. 22-24, 2004.

Xilinx Inc., "XtremeDSP Design Considerations User Guide," v 1.2, Feb. 4, 2005.

Altera Corporation, "Advanced Synthesis Cookbook: A Design Guide for Stratix II, Stratix III and Stratix IV Devices," Document Version 3.0, 112 pgs., May 2008.

deDinechin, F. et al., "Large multipliers with less DSP blocks," retrieved from http://hal-ens-lyon.archives-ouvertes.fr/ensl-00356421/en/, 9 pgs., available online Jan. 2009.

Wajih, E.-H.Y. et al., "Efficient Hardware Architecture of Recursive Karatsuba-Ofman Multiplier," *3rd International Conference on Design and Technology of Integrated Systems in Nanoscale Era*, 6 pgs., Mar. 2008.

Zhou, G. et al., "Efficient and High-Throughput Implementations of AES-GCM on FPGAs," *International Conference on Field-Programmable Technology*, 8 pgs., Dec. 2007.

Altera Corporation, "Statix II Device Handbook, Chapter 6—DSP Blocks in Stratix II Devices," v1.1, Jul. 2004.

Xilinx Inc., "Complex Multiplier v2.0", DS291 Product Specification/Datasheet, Nov. 2004.

Martinson, L. et al., "Digital Matched Filtering with Pipelined Floating Point Fast Fourier Transforms (FFT's)," *IEEE Transactions on Acoustics, Speech, and Signal Processing*, vol. ASSP-23, No. 2, pp. 222-234, Apr. 1975.

Amos, D., "PLD architectures match DSP algorithms," *Electronic Product Design*, vol. 17, No. 7, Jul. 1996, pp. 30, 32.

Analog Devices, Inc., The Applications Engineering Staff of Analog Devices, DSP Division, *Digital Signal Processing Applications Using the ADSP-2100 Family* (edited by Amy Mar), 1990, pp. 141-192).

Andrejas, J., et al., "Reusable DSP functions in FPGAs," *Field-Programmable Logic and Applications. Roadmap to Reconfigurable Computing. 10th International Conference, FPL 2000. Proceedings (Lecture Notes in Computer Science* vol. 1896), Aug. 27-30, 2000, pp. 456-461.

Aoki, T., "Signed-weight arithmetic and its application to a field-programmable digital filter architecture," *IEICE Transactions on Electronics*, 1999, vol. E82C, No. 9, Sep. 1999, pp. 1687-1698.

Ashour, M.A., et al., "An FPGA implementation guide for some different types of serial-parallel multiplier-structures," *Microelectronics Journal*, vol. 31, No. 3, 2000, pp. 161-168.

Berg. B.L., et al."Designing Power and Area Efficient Multistage FIR Decimators with Economical Low Order Filters," *ChipCenter Technical Note*, Dec. 2001.

Bursky, D., "Programmable Logic Challenges Traditional ASIC SoC Designs", *Electronic Design*, Apr. 15, 2002.

Chhabra, A. et al., Texas Instruments Inc., "A Block Floating Point Implementation on the TMS320C54x DSP", Application Report SPRA610, Dec. 1999, pp. 1-10.

(56) References Cited

OTHER PUBLICATIONS

Colet, p., "When DSPs and FPGAs meet: Optimizing image processing architectures," *Advanced Imaging*, vol. 12, No. 9, Sep. 1997, pp. 14, 16, 18.

Crookes, D., et al., "Design and implementation of a high level programming environment for FPGA-based image processing," *IEE Proceedings-Vision, Image and Signal Processing*, vol. 147, No. 4, Aug. 2000, pp. 377-384.

Debowski, L., et al., "A new flexible architecture of digital control systems based on DSP and complex CPLD technology for power conversion applications," *PCIM 2000: Europe Official Proceedings of the Thirty-Seventh International Intelligent Motion Conference*, Jun. 6-8, 2000, pp. 281-286.

Dick, C., et al., "Configurable logic for digital communications: some signal processing perspectives," *IEEE Communications Magazine*, vol. 37, No. 8, Aug. 1999, pp. 107-111.

Do, T.-T., et al., "A flexible implementation of high-performance FIR filters on Xilinx FPGAs," *Field-Programmable Logic and Applications: From FPGAs to Computing Paradigm. 8th International Workshop, FPL '98. Proceedings*, Hartenstein, R.W., et al., eds., Aug. 31-Sep. 3, 1998, pp. 441-445.

Gaffer, A.A., et al., "Floating-Point Bitwidth Analysis via Automatic Differentiation," *IEEE Conference on Field Programmable Technology*, Hong Kong, Dec. 2002.

Guccione, S.A.,"Run-time Reconfiguration at Xilinx," *Parallel and distributed processing: 15 IPDPS 2000 workshops*, Rolim, J., ed., May 1-5, 2000, p. 873.

Hauck, S., "The Future of Reconfigurable Systems," *Keynote Address, 5th Canadian Conference on Field Programmable Devices*, Jun. 1998, http://www.ee.washington.edu/people/faculty/hauck/publications/ReconfigFuture.PDF.

Heysters, P.M., et al., "Mapping of DSP algorithms on field programmable function arrays," *Field-Programmable Logic and Applications. Roadmap to Reconfigurable Computing. 10th International Conference, FPL 2000 Proceedings (Lecture Notes in Computer Science* vol. 1896) Aug. 27-30, 2000, pp. 400-411.

Huang, J., et al., "Simulated Performance of 1000BASE-T Receiver with Different Analog Front End Designs," *Proceedings of the 35th Asilomar Conference on Signals, Systems, and Computers*, Nov. 4-7, 2001.

Lattice Semiconductor Corp, *ORCA® FPGA Express™ Interface Manual: ispLEVER®* Version 3.0, 2002.

Lucent Technologies, Microelectronics Group,"Implementing and Optimizing Multipliers in ORCA™ FPGAs,", Application Note. AP97-008FGPA, Feb. 1997.

"Implementing Multipliers in FLEX 10K EABs", *Altera*, Mar. 1996.

"Implementing Logic with the Embedded Array in FLEX 10K Devices", *Altera*, May 2001, ver. 2.1.

Jinghua Li, "Design a pocket multi-bit multiplier in FPGA," *1996 2nd International Conference on ASIC Proceedings* (IEEE Cat. No. 96TH8140) Oct. 21-24, 1996, pp. 275-279.

Jones, G., "Field-programmable digital signal conditioning," *Electronic Product Design*, vol. 21, No. 6, Jun. 2000, pp. C36-C38.

Kiefer, R., et al., "Performance comparison of software/FPGA hardware partitions for a DSP application," *14th Australian Microelectronics Conference Microelectronics: Technology Today for the Future. MICRO '97 Proceedings*, Sep. 28-Oct. 1, 1997, pp. 88-93.

Kramberger, I., "DSP acceleration using a reconfigurable FPGA," *ISIE '99. Proceedings of the IEEE International Symposium on Industrial Electronics* (Cat. No. 99TH8465), vol. 3 , Jul. 12-16, 1999, pp. 1522-1525.

Langhammer, M., "How to implement DSP in programmable logic," *Elettronica Oggi*, No. 266 , Dec. 1998, pp. 113-115.

Langhammer, M., "Implementing a DSP in Programmable Logic," *Online EE Times*, May 1998, http://www.eetimes.com/editorial/1998/coverstory9805.html.

Lazaravich, B.V., "Function block oriented field programmable logic arrays," *Motorola, Inc. Technical Developments*, vol. 18, Mar. 1993, pp. 10-11.

Lund, D., et al., "A new development system for reconfigurable digital signal processing," *First International Conference on 3G Mobile Communication Technologies* (Conf. Publ. No. 471), Mar. 27-29, 2000, pp. 306-310.

Miller, N.L., et al., "Reconfigurable integrated circuit for high performance computer arithmetic," *Proceedings of the 1998 IEE Colloquium on Evolvable Hardware Systems (Digest)* No. 233, 1998, pp. 2/1-2/4.

Mintzer, L., "Xilinx FPGA as an FFT processor," *Electronic Engineering*, vol. 69, No. 845, May 1997, pp. 81, 82, 84.

Faura et al., "A Novel Mixed Signal Programmable Device With On-Chip Microprocessor," Custom Integrated Circuits Conference, 1997. Proceedings of the IEEE 1997 Santa Clara, CA, USA, May 5, 1997, pp. 103-106.

Nozal, L., et al., "A new vision system: programmable logic devices and digital signal processor architecture (PLD+DSP)," *Proceedings IECON '91. 1991 International Conference on Industrial Electronics, Control and Instrumentation* (Cat. No. 91CH2976-9) vol. 3, Oct. 28-Nov. 1, 1991, pp. 2014-2018.

Papenfuss, J.R, et al., "Implementation of a real-time, frequency selective, RF channel simulator using a hybrid DSP-FPGA architecture," *RAWCON 2000: 2000 IEEE Radio and Wireless Conference* (Cat. No. 00EX404), Sep. 10-13, 2000, pp. 135-138.

Parhami, B., "Configurable arithmetic arrays with data-driven control," *34th Asilomar Conference on Signals, Systems and Computers*, vol. 1, 2000, pp. 89-93.

"The QuickDSP Design Guide", Quicklogic, Aug. 2001, revision B.

"QuickDSP™ Family Data Sheet", *Quicklogic*, Aug. 7, 2001, revision B.

Rangasayee, K., "Complex PLDs let you produce efficient arithmetic designs," *EDN (European Edition)*, vol. 41, No. 13, Jun. 20, 1996, pp. 109, 110, 112, 114, 116.

Rosado, A., et al., "A high-speed multiplier coprocessor unit based on FPGA," *Journal of Electrical Engineering*, vol. 48, No. 11-12, 1997, pp. 298-302.

Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications* (Cat. No.99EX303), Jul. 26-28, 1999, pp. 147-150.

Texas Instruments Inc., "TMS320C54x DSP Reference Set, vol. 1: CPU and Peripherals", Literature No. SPRU131F, Apr. 1999, pp. 2-1 through 2-16 and 4-1 through 4-29.

Tisserand, A., et al., "An on-line arithmetic based FPGA for low power custom computing," *Field Programmable Logic and Applications, 9th International Workshop, FPL '99, Proceedings (Lecture Notes in Computer Science* vol. 1673), Lysaght, P., et al., eds., Aug. 30-Sep. 1, 1999, pp. 264-273.

Tralka, C., "Symbiosis of DSP and PLD," *Elektronik*, vol. 49, No. 14 , Jul. 11, 2000, pp. 84-96.

Valls, J., et al., "A Study About FPGA-Based Digital Filters," *Signal Processing Systems*, 1998, SIPS 98, 1998 IEEE Workshop, Oct. 10, 1998, pp. 192-201.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

"Virtex-II 1.5V Field-Programmable Gate Arrays", *Xilinx*, Apr. 2, 2001, module 2 of 4.

Walters, A.L., "A Scaleable FIR Filter Implementation Using 32-bit Floating-Point Complex Arithmetic on ,a FPGA Based Custom Computing Platform," Allison L. Walters, Thesis Submitted to the Faculty of Virginia Polytechnic Institute and State University, Jan. 30, 1998.

Weisstein, E.W., "Karatsuba Multiplication," *MathWorld—A Wolfram Web Resource* (Dec. 9, 2007), accessed Dec. 11, 2007 at http://mathworld.wolfram.com/KaratsubaMultiplication.html.

Wenzel, L., "Field programmable gate arrays (FPGAs) to replace digital signal processor integrated circuits," *Elektronik*, vol. 49, No. 5, Mar. 7, 2000, pp. 78-86.

"Xilinx Unveils New FPGA Architecture to Enable High-Performance, 10 Million System Gate Designs", *Xilinx*, Jun. 22, 2000.

(56) References Cited

OTHER PUBLICATIONS

"Xilinx Announces DSP Algorithms, Tools and Features for Virtex-II Architecture", *Xilinx*, Nov. 21, 2000.

Xilinx Inc., "Virtex-II 1.5V Field-Programmable Gate Arrays", Advance Product Specification, DS031-2 (v1.9), Nov. 29, 2001, Module 2 of 4, pp. 1-39.

Xilinx Inc., "Using Embedded Multipliers", Virtex-II Platform FPGA Handbook, UG002 (v1.3), Dec. 3, 2001, pp. 251-257.

Xilinx, Inc., "A 1D Systolic FIR," copyright 1994-2002, downloaded from http://www.iro.umontreal.ca/~aboulham/F6221/Xilinx%20A%201D%20systolic%20FIR.htm.

Xilinx, Inc., "The Future of FPGA's," White Paper, available Nov. 14, 2005 for download from http://www.xilinx.com/prs_rls,5yrwhite.htm.

Farooqui, A., et al., "General Data-Path Organization of a MAC unit for VLSI Implementation of DSP Processors," ISCAS '98, Part 2, May 31, 1998-Jun. 3, 1998, pp. 260-263.

Haynes, S.D., et al., "Configurable multiplier blocks for embedding in FPGAs," *Electronics Letters*, vol. 34, No. 7, pp. 638-639 (Apr. 2, 1998).

Kim, Y., et al., "Fast GPU Implementation for the Solution of Tridiagonal Matrix Systems," *Journal of Korean Institute of Information Scientists and Engineers*, vol. 32, No. 12, pp. 692-704, Dec. 2005.

* cited by examiner

HIGH-RATE INTERPOLATION OR DECIMATION FILTER IN INTEGRATED CIRCUIT DEVICE

BACKGROUND OF THE INVENTION

This invention relates to the implementation of high-rate interpolation or decimation filters on integrated circuit devices, especially programmable integrated circuit devices such as programmable logic devices (PLDs).

Finite impulse response (FIR) filters are commonly used in digital signal processing. FIR filters include interpolation and decimation filters, in which, in order to add or remove samples, respectively, by a certain factor N, each input sample has to be held while calculations for the N−1 interpolated samples are made, or each output sample has to be held while calculations for the N−1 decimated samples are made. If the filter is to operate in real time, the portion of the filter that performs those calculations has to run at N times the input sample rate (in the interpolation case) or the output sample rate (in the decimation case).

However, the filter cannot run faster than the clock rate of the device on which the filter is built. This becomes more of an issue as data rates of signals to be processed increase. If the filter is built in fixed logic, it may be possible to design the device speed to take the data rate into account. But on a programmable device, such as a PLD, one cannot know, when designing the programmable device itself, what kind of logic a user may want to program onto the device, so the device clock rate cannot be designed with a particular data rate in mind. And even with a fixed device, the ability to design to any clock rate may be limited.

In addition, the number of filter taps is directly proportional to the ratio of sample rate to transition bandwidth. Each filter tap requires at least one multiplier. Again, on a fixed device, one may be able to provide whatever number of multipliers one needs (although again, there may be reasons why there are limits to the number of multipliers), but on a programmable device, a certain number of multipliers will be provided but it is not possible to predict how many a user may need. One solution that a user may resort to is to break the filter down into stages, thereby limiting the number of multipliers required. However, the data rate increases with each stage, so the problem of the input rate for later stages (in the interpolation case), or the output rate for earlier stages (in the decimation case), exceeding the device rate may arise for this reason as well.

SUMMARY OF THE INVENTION

In accordance with the present invention, an interpolation filter not only may be broken into stages, but each stage may be broken into subfilters, which divides the output into phases. The number of subfilters or phases in the final stage is equal to the factor by which the data rate would otherwise increase. Thus, in one example, for an interpolation factor of M, the output data rate can be kept within the device rate by providing M subfilters, yielding M output phases each having an output rate equal to the input rate. The effective, or synthesized, output rate in such a case is M times the input rate.

Moreover, the number of input phases will increase with each stage. For stages after the first stage, the number of input phases would be the number of output phases of the previous stage. However, even for the first stage, the number of input phases may be greater than one. To generalize, for each stage, there may be any number of input phases (Pi), and a stage interpolation factor (Ms), yielding a number of output phases (Po), where Po=Pi Ms. Each output phase is produced by a subfilter, so there are Po subfilters. Each subfilter has Pi branches to accept the Pi input phases.

For the filter as a whole, having n stages, the overall effective interpolation factor is:

$$M = \prod_{j=1}^{n} M_{sj}$$

However, while the effective output data rate is M times the input data rate Ri, the actual data rate of each output phase is only MRi/Pof where Pof is the number of final output phases.

The case of a decimation filter is similar. For an overall decimation factor of M, there can be more than one stage. Because in decimation, the number of samples is decreased by the filter, the number of input phases exceeds the number of output phases. Thus the earlier stages have the larger number of subfilters sampling the respective input phases. The output phases of the subfilters in the earlier stage are combined for input to corresponding taps of the subfilters in the later stage. While the effective input data rate is M times the output data rate Ro, the actual data rate of each input phase is only MRo/Pif where Pif is the number of initial input phases.

Therefore, in accordance with the present invention, there is provided a FIR filter structure on an integrated circuit device for processing data samples and a set of a number of coefficients at an effective data rate that exceeds a maximum data rate of said device by a factor. The FIR filter structure includes a plurality of FIR filter stages including at least an initial filter stage and a final filter stage. Each of the filter stages has one or more subfilters. A first one of the initial and final filter stages has a number of subfilters that exceeds a number of subfilters in a second of the initial and final filter stages by the aforementioned factor. Each subfilter in each respective filter stage convolves input data with a subset of coefficients whose number is related to a number of subfilters in an adjacent filter stage.

A method of configuring such circuitry on a programmable device, a programmable device so configurable, and a machine-readable data storage medium encoded with software for performing the method, are also provided.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

A FIR filter calculates a weighted sum of a finite number of inputs, summing a number of multiplication results, where each multiplication is between a sample and a coefficient. Each such multiplication may be referred to as a "tap." Mathematically, a FIR filter may be described as:

$$Y_k = \sum_{i=0}^{Taps-1} ci \cdot Sk - i$$

where Yk is the kth output term, ci is the ith coefficient, sk-i is the (k−i)th sample, and Taps is the number of taps in the filter.

One example of a digital signal processing block for a programmable device, that may be configured as different types of filters, including an interpolation FIR filter and a decimation FIR filter, is shown in copending, commonly-assigned U.S. patent application Ser. No. 11/447,370, filed Jun. 5, 2006, which is hereby incorporated by reference herein in its entirety, although the present invention may be used with other types of devices.

In the case of interpolation, one inserts outputs between the outputs that are generated based on input samples. In the case, for example, of interpolation by two, one must create one output between each output based on an input sample. Therefore, the FIR filter circuitry must generate two outputs in the time interval occupied by one input—i.e., it must run at twice the input clock rate. For interpolation by a higher factor M, the circuitry must generate M−1 outputs between the outputs that are generated based on input samples, or a total of M outputs in the time interval occupied by one input—i.e., in a conventional interpolation filter, the circuitry must run at M times the input clock rate.

Similarly in the case of decimation, only one output is generated for every M inputs. In the case, for example, of decimation by two, one must accept two inputs for each output sample generated per output clock. Therefore, the FIR filter circuitry must generate an output in the time interval occupied by two inputs—i.e., it must run at twice the output clock rate. For decimation by a higher factor M, the circuitry must generate an output in the time interval occupied by M inputs—i.e., in a conventional interpolation filter, the circuitry must run at M times the output clock rate.

Figure 1:
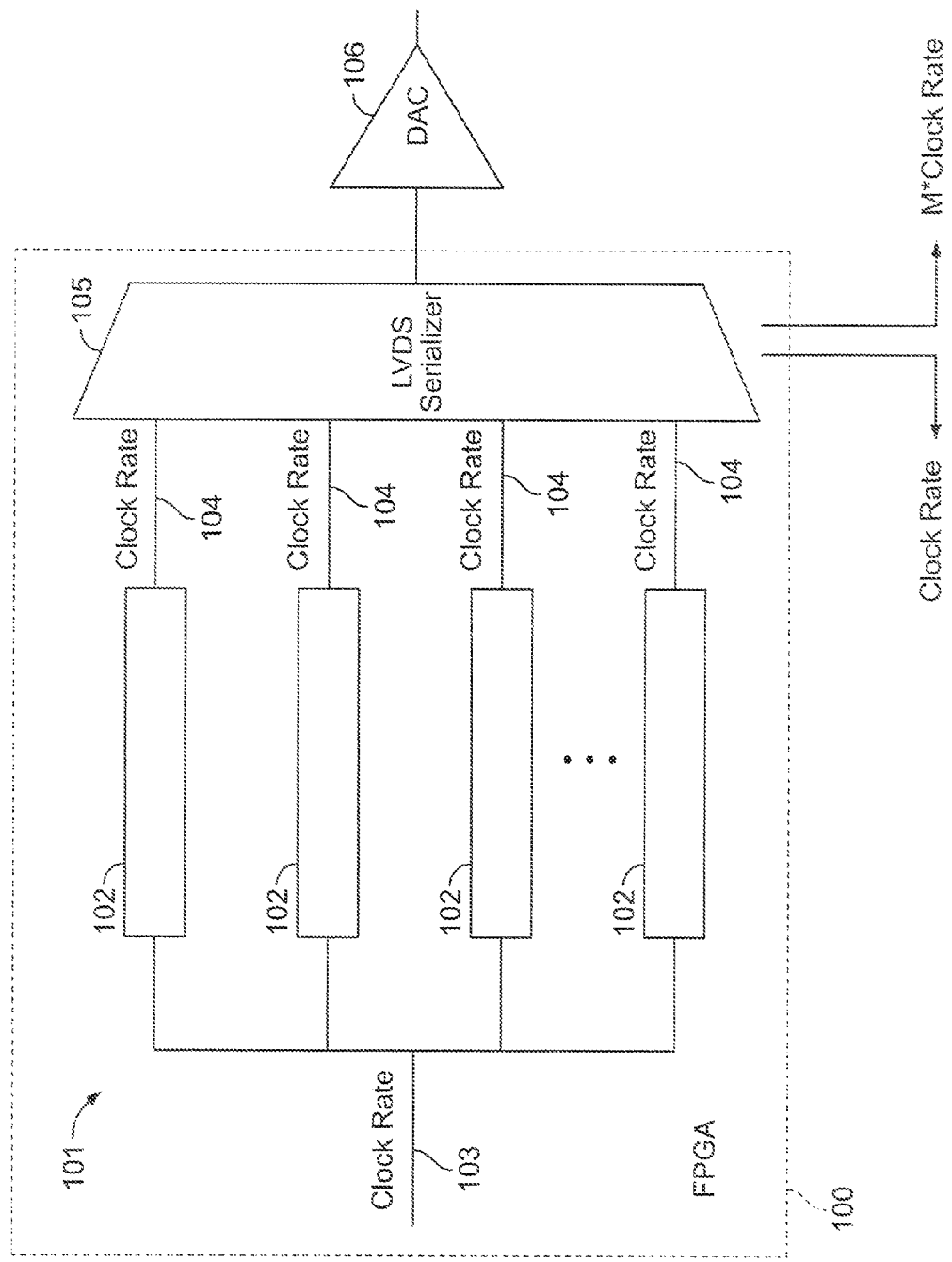
FIG. 1 is a representation of a conventional polyphase 1:M interpolation filter.

FIG. 1 shows an example of a conventional polyphase 1:M interpolation filter 101. In this example, interpolation filter 101 is configured on a programmable logic device 100 which may be an FPGA. Filter 101 is decomposed into M subfilters 102, where M is the interpolation factor. Both the input 103 and the M output legs 104 run at the device clock rate ("ClockRate"). Each leg represents every Mth sample and is shifted by one sample from the previous leg. An LVDS serializer 105 may be used to multiplex the M legs into a single signal at a synthesized higher output sample rate MxClockRate for further processing by digital-to-analog converter 106 and beyond.

Figure 2:
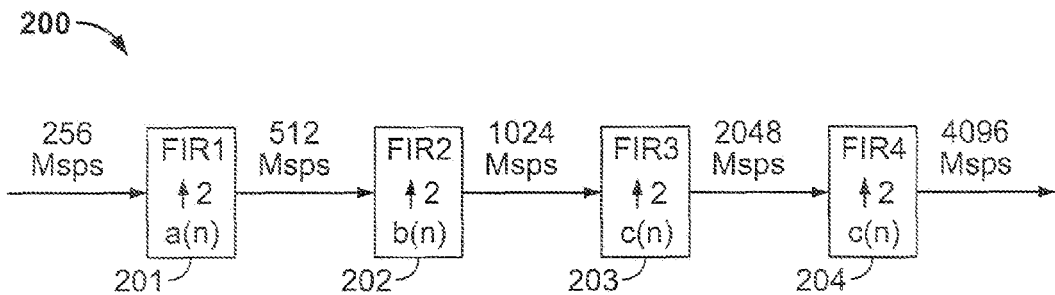
FIG. 2 is a representation of a conventional interpolation filter broken into stages.

The invention will now be described with reference to FIGS. 2-4, using interpolation as an example.

Many gigabit serial data standards now support synthesized output sample rates at or exceeding one billion samples per second (1 Gsps), but device clock rates have not kept pace, resulting in ever-higher interpolation factors M. Because the input data rate cannot exceed the device clock rate, sampling is performed with a narrow transition bandwidth. According to the filter design theory, the number of filter taps is proportional to the ratio of sample frequency to transition bandwidth. The use of ever-higher interpolation factors increases this ratio by both increasing the numerator and decreasing the denominator, thereby greatly increasing the number of filter taps. Each filter tap requires at least one multiplier, and if the number of multipliers on the device is limited, as it would be on a programmable device such as an FPGA that is not manufactured with a particular filter implementation in mind (and as might be the case even in a fixed logic device for other manufacturing reasons) the required number of taps could exceed the available number of multipliers on the device.

One known solution is to break down the 1:M interpolation into a number of cascaded filter stages to reduce the total number of multipliers. FIG. 2 shows an example of such a cascaded interpolation filter 200, in which M=16. As shown, the input data rate is 256 Msps, while the output data rate is 4096 Msps (i.e., 4 Gsps). Low-pass filtering may be used to preserve the input bandwidth while preventing aliasing due to the up-sampling process. In this design, the interpolation-by-16 filter is broken down into four stages 201-204, each of which may be an interpolation-by-2 filter. The output rate of each stage 201-204 is twice that stage's input rate, and that output rate becomes the input rate for the next one of stages 202-204. However, at some point in the cascade, the output rate of one of the stages may exceed the device clock rate, requiring the subsequent stage to have an input clock rate higher than the device clock rate, which is not permitted.

Figure 3:
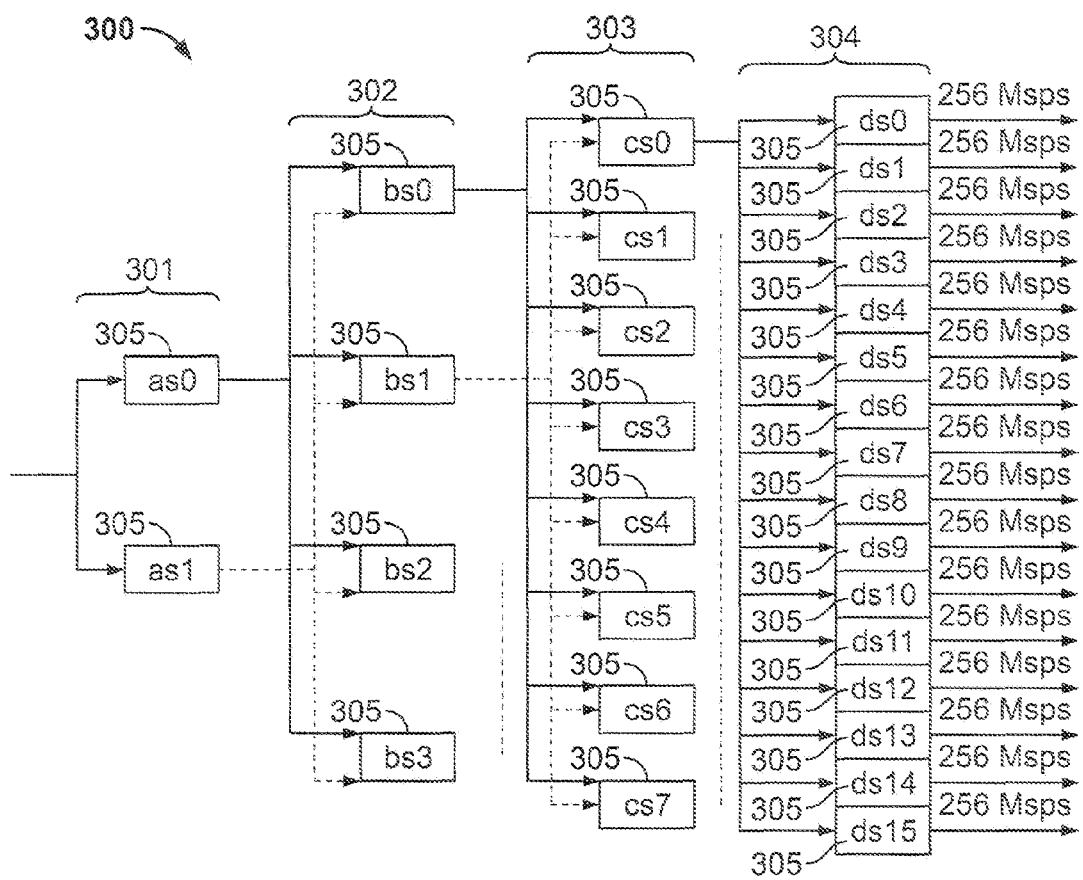
FIG. 3 is a representation of an interpolation filter according to an embodiment of the present invention.

Therefore, in accordance with an embodiment of the present invention, filter 300 may be provided, as shown in FIG. 3. Filter 300 is broken down into stages 301-304, similar to stages 201-204 of filter 200, except that each stage 301-304 is broken down into subfilters 305, each of which provides a separate phase of the output of stage 301-304. In this way, the output rate of each subfilter 305 can be designed so that it does not exceed the input rate of the next subfilter 305 (i.e., does not exceed the device clock rate). The synthesized output rate of the stage 301-304 is the sum of the output rates of the individual subfilters 305 in the final stage 304.

The output rate of each subfilter 305 may be the same as the original input rate of the first stage 301, and the full multiplication of the input rate by M to achieve the final output rate is accomplished by having M subfilters 305 in the final stage 304. Alternatively, the output rate of each subfilter 305 may be the more or less than the original input rate of the first stage 301, as long as it does not exceed the device rate, and the number of subfilters 305 in final stage 304 can be adjusted accordingly.

Figure 4:
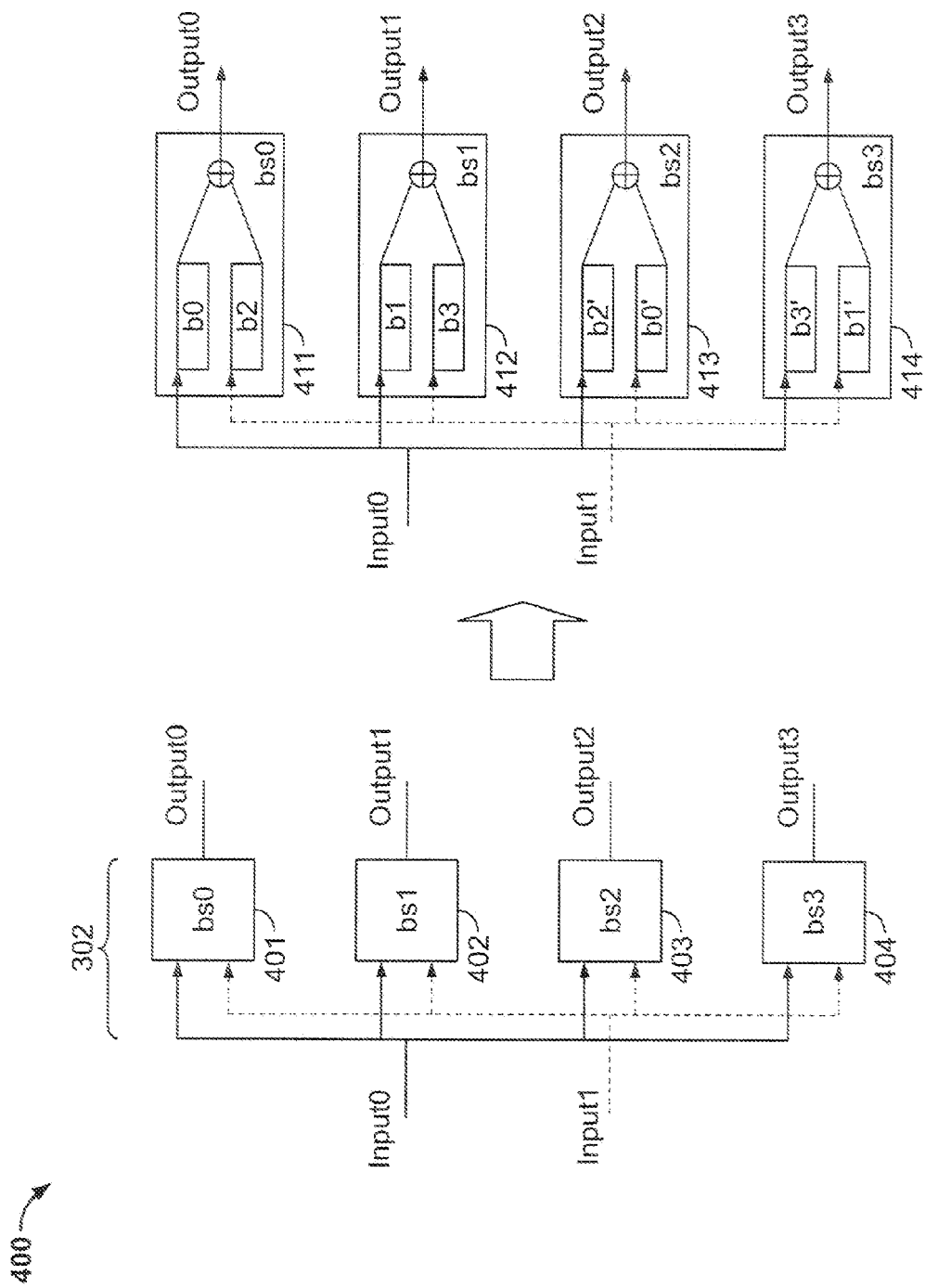
FIGS. 4 and 5 are representations of one of the stages of the embodiment of FIG. 3.

FIG. 4 shows an embodiment 400 of the implementation of the subfilters bs0 (401), bs1 (402), bs2 (402), and bs3 (404) of filter stage 302. Filter stage 302 has a set of coefficients b(n), (n=0, . . . , N−1), where N equals the number of taps, which preferably is a multiple of the number of output phases Po (i.e., 4, in this example). To create the Po subfilters, b(n) is decomposed into Po decomposed filters (b0, b1, b2, b3 in this example), each of which starts at the nth coefficient and takes every Poth coefficient. The decomposed filters can them be combined according to the needs of the particular situation, including delaying and rotating the decomposed filters.

Figure 5:
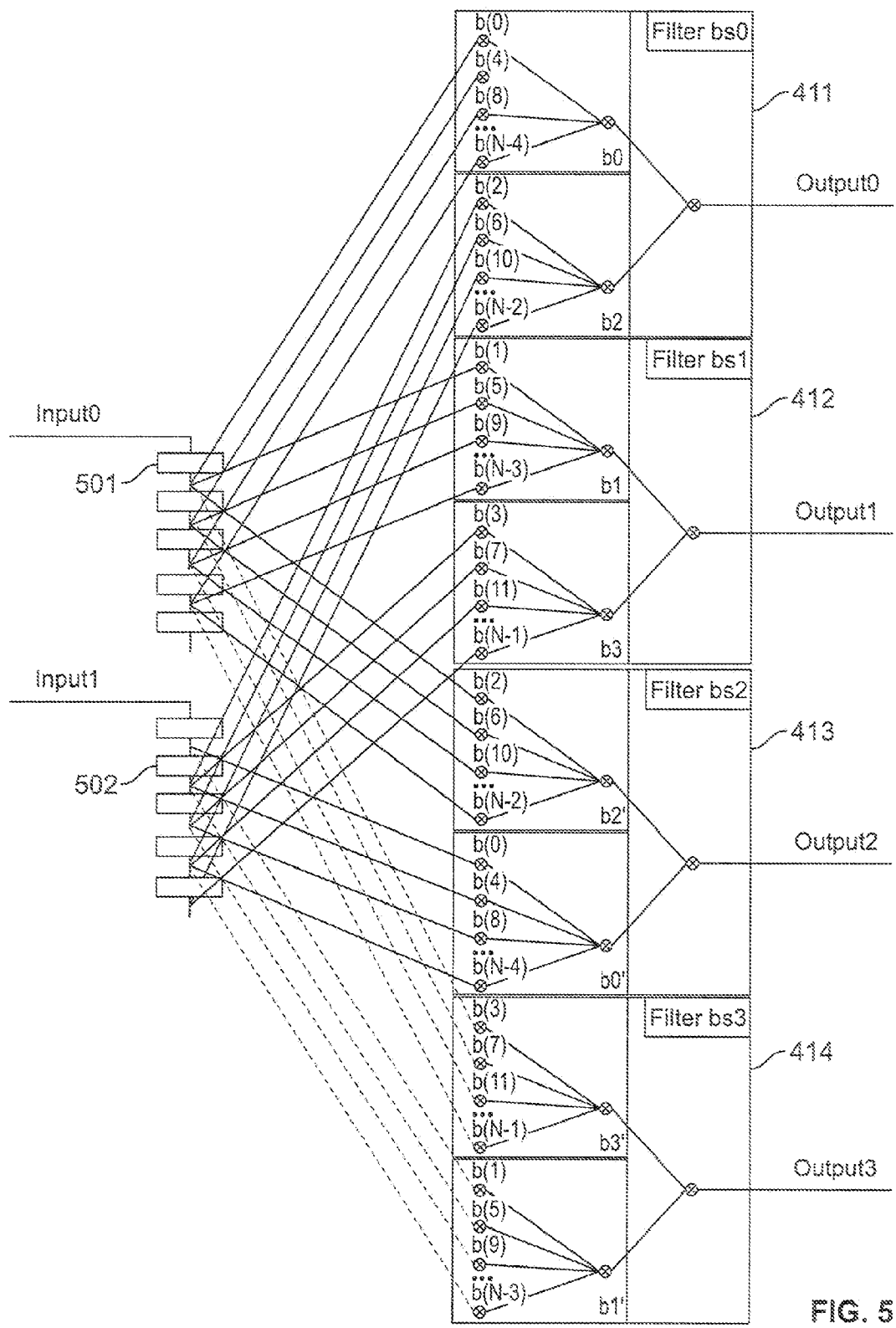

Thus, as seen in FIG. 4, and in more detail in FIG. 5, subfilters bs0 (401) and bs2 (403) both include decomposed filters b0 and b2, but in bs2 (403), the subfilters are rotated as compared to bs0 (401). Moreover, as seen in FIG. 5, while in subfilter bs2 (403), the b2' inputs are taken starting after the first delay 501 of input0, in subfilter bs0 (401), the b2 inputs are taken starting after the second delay 502 of input1. These rotations and delays are exemplary only, and will be determined by the user as a function of the particular application when the filter is designed.

More generally, each of n subfilters picks a consistent pattern of coefficients—e.g., every nth coefficient, with the starting point and rotation determined by the user as a function of the particular application when the filter is designed. Over all of the subfilters, each of the coefficients is selected Ms times.

Although in the example shown in FIG. 3, the number of phases output by the final stage is equal to the overall interpolation factor M so that there is no change in data rate, the number of subfilters per stage can be arranged to provide any desired relationship of the number output phases to the interpolation factor, and therefore any desired change in data rate (within the limitations of the device).

Figure 6:
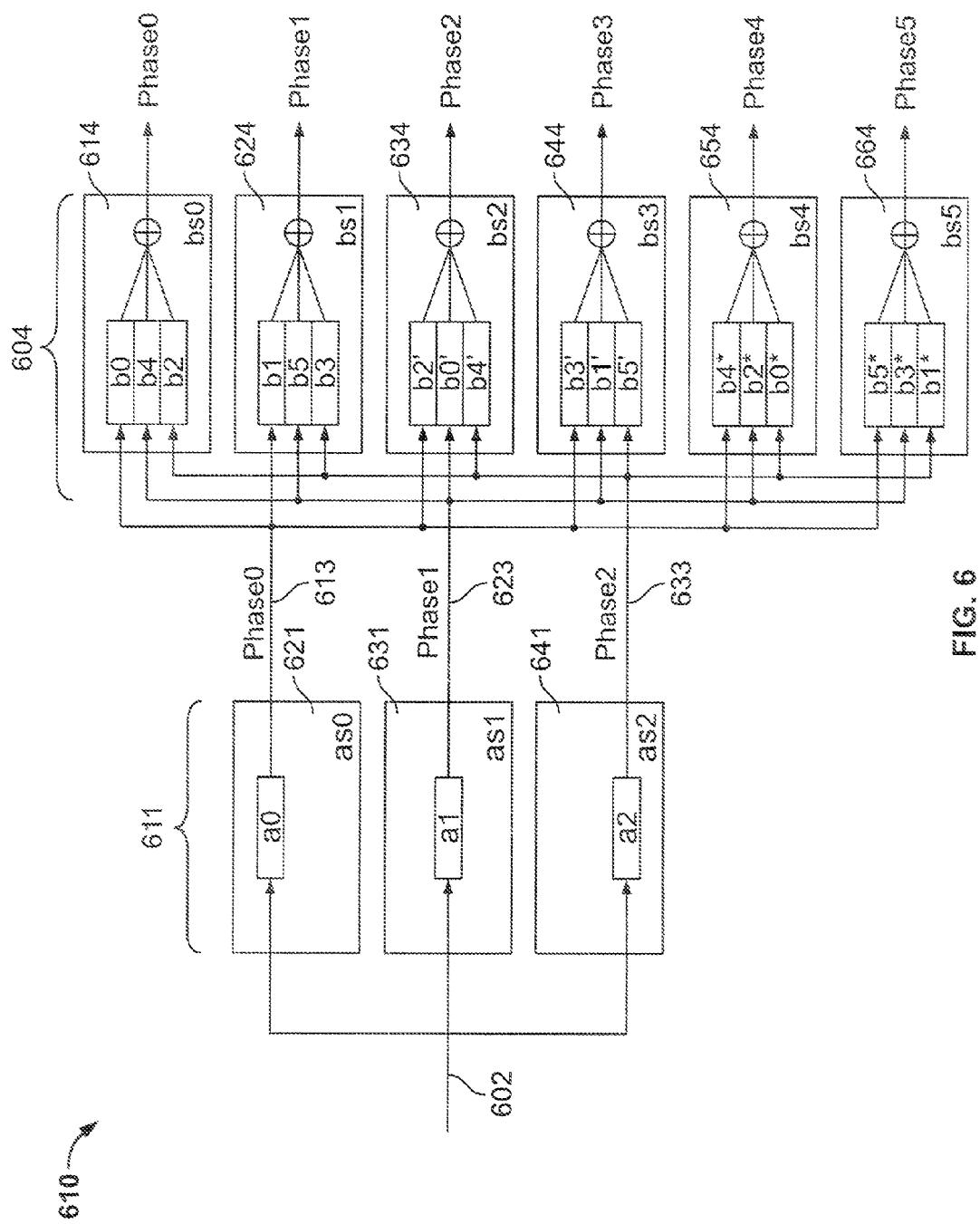
FIG. 6 is a representation of an interpolation filter according to another embodiment of the present invention.

Another example 610 of interpolation-by-6, in two filter stages, is shown in FIG. 6. The first stage 611 includes three subfilters 621, 631, 641 of a filter a, which take a single input phase 612 and provide three intermediate phases 613, 623, 633, which are input to second filter stage 604 including six subfilters 614, 624, 634, 644, 654, 664 of a filter b. Each subfilter in second stage 604 convolves the intermediate phases with either even or odd coefficients, which may be delayed or rotated.

Figure 7:
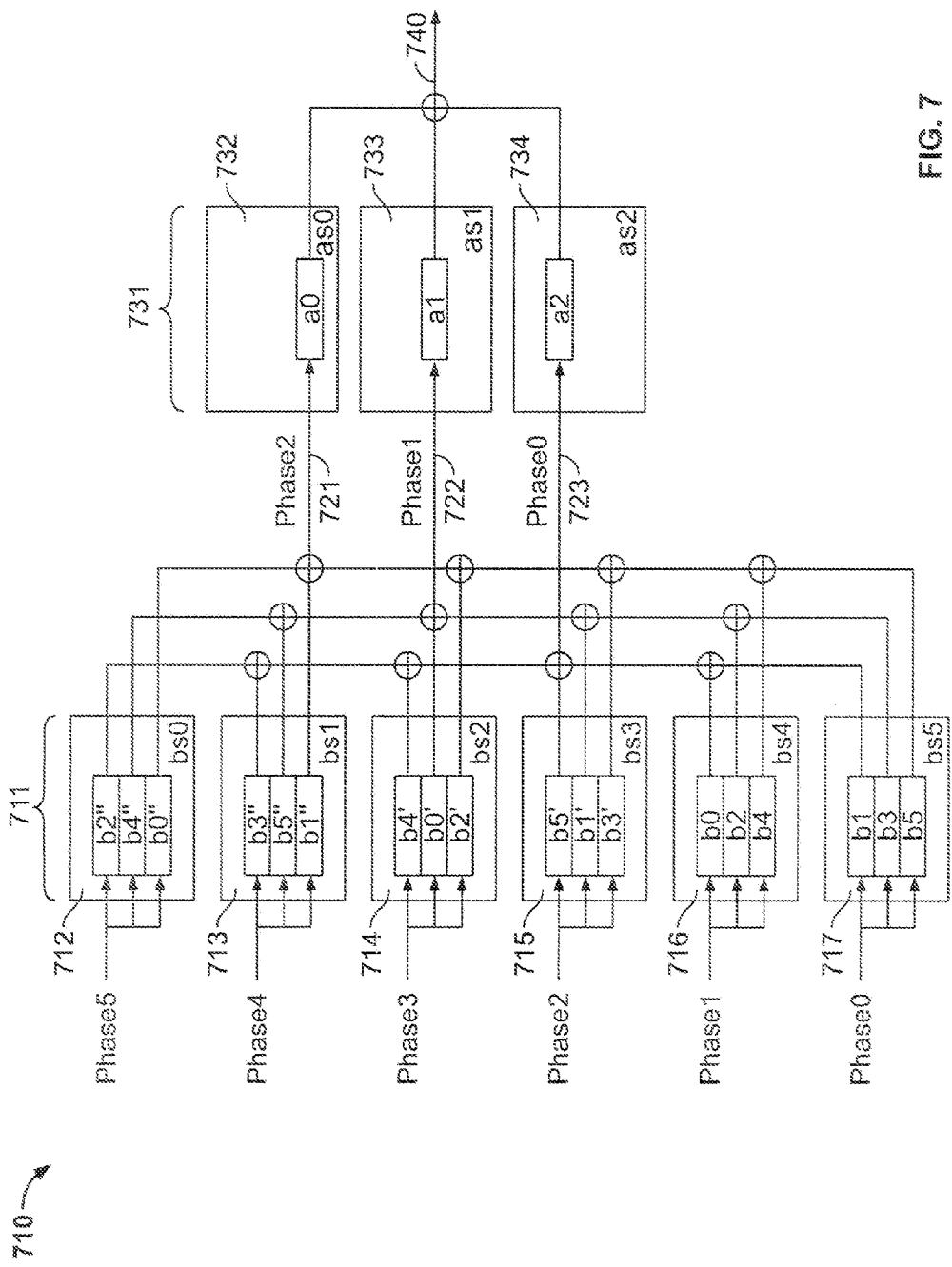
FIG. 7 is a representation of an decimation filter according to still another embodiment of the present invention.

FIG. 7 shows an example 710 of decimation-by-6 in two stages. First filter stage 711 including six subfilters 712, 713, 714, 715, 716, 717 of a filter b. Each subfilter in first stage 711 convolves the six input phases with either even or odd coefficients, which may be delayed or rotated, each providing three outputs that are combined into three intermediate phases 721, 722, 723. The second stage 731 includes three subfilters 732, 733, 734 of a filter a, which take the three intermediate phases 721, 722, 723 and provide a single output phase 740.

These arrangements can be proven mathematically. A regular interpolation-by-two filter can be represented by $$\underline{y} = H \underline{x}$$

More specifically, $$\begin{bmatrix} \vdots \\ y(2i-2) \\ y(2i-1) \\ y(2i) \\ y(2i+1) \\ y(2i+2) \\ y(2i+3) \\ \vdots \end{bmatrix}_{\underline{y}} = \underbrace{\begin{bmatrix} & \vdots & & \\ & h(N-2) & & \\ & h(N-1) & & \\ \cdots & h(0) & h(N-2) & \\ & h(1) & h(N-1) & \\ \cdots & h(2) & h(0) & h(N-2) & \cdots \\ & \vdots & h(1) & h(N-1) \\ & h(N-2) & h(2) & h(0) \\ & h(N-1) & \vdots & h(1) \\ & \vdots & h(N-2) & h(2) \\ & & h(N-1) & \vdots \\ & & \vdots & h(N-2) \\ & & & h(N-1) \\ & & & \vdots \end{bmatrix}}_{H} \cdot \begin{bmatrix} \vdots \\ x(i-1) \\ x(i) \\ x(i+1) \\ \vdots \end{bmatrix}_{\underline{x}}$$

where N=length of the original filter, and h(0) ... h(N−1)=the coefficients of the original filter.

Because the output data rate can not actually be faster than clock rate of the device, the interpolation-by-2 can be performed with 1-to-2 polyphase filter.

$$\begin{bmatrix} \vdots \\ y(2i-2) \\ y(2i) \\ y(2i+2) \\ \vdots \\ \hline \vdots \\ y(2i-1) \\ y(2i+1) \\ y(2i+3) \\ \vdots \end{bmatrix} = \underbrace{\begin{bmatrix} \vdots & & \\ h(N-4) & \vdots & \\ h(N-2) & h(N-4) & \vdots \\ h(0) & h(N-2) & h(N-4) \\ \cdots & j(2) & h(0) & h(N-2) & \cdots \\ h(4) & h(2) & h(0) \\ \vdots & h(4) & h(2) \\ h(N-4) & \vdots & h(4) \\ h(N-2) & h(N-4) & \vdots \\ \vdots & h(N-2) & h(N-4) \\ & \vdots & h(N-2) \\ & & \vdots \\ \hline \vdots & & \\ h(N-3) & \vdots & \\ h(N-1) & h(N-3) & \vdots \\ h(1) & h(N-1) & h(N-3) \\ h(3) & h(1) & h(N-1) \\ \cdots & h(5) & h(3) & h(1) & \cdots \\ \vdots & h(5) & h(3) \\ h(N-3) & \vdots & h(5) \\ h(N-1) & h(N-3) & \vdots \\ \vdots & h(N-1) & h(N-3) \\ & \vdots & h(N-1) \\ & & \vdots \end{bmatrix}}_{\tilde{H}} \cdot \begin{bmatrix} \vdots \\ x(i-1) \\ x(i) \\ x(i+1) \\ \vdots \end{bmatrix}_{\underline{x}}$$

To simplify the notation, the above can be written as:

$$\begin{bmatrix} \underline{y_0} \\ \underline{y_1} \end{bmatrix} = \tilde{H} \underline{x} = \begin{bmatrix} H_0 \\ H_1 \end{bmatrix} \cdot \underline{x}$$

However, the foregoing notation assumes the input data rate is lower or equal to the clock rate in the device. When the input data rate is faster than clock rate, the input can be separated into different phases as well. For example, an interpolation-by-2 filter can be designed as a 2 phase input/4 phase output system:

$$\begin{bmatrix} \underline{y_0} \\ \underline{y_1} \\ \underline{y_2} \\ \underline{y_3} \end{bmatrix} = \tilde{H} \cdot \underline{x} = \begin{bmatrix} H_0 & H_2^* \\ H_1 & H_3^* \\ H_2 & H_0 \\ H_3 & H_1 \end{bmatrix} \cdot \begin{bmatrix} \underline{x_0} \\ \underline{x_1} \end{bmatrix}$$

Hp is the filter matrix of the pth phase of an M-phase polyphase decomposition of the original filter H, where M is the number of output phases. For example:

$$H_0 = \begin{bmatrix} & \vdots & & & & \\ & h(N-2M) & \vdots & & & \\ & h(N-M) & h(N-2M) & \vdots & & \\ & h(0) & h(N-M) & h(N-2M) & & \\ \ldots & h(M) & h(0) & h(N-M) & \ldots \\ & h(2M) & h(M) & h(0) & & \\ & \vdots & h(2M) & h(M) & & \\ & h(N-2M) & \vdots & h(2M) & & \\ & h(N-M) & h(N-2M) & \vdots & & \\ & \vdots & h(N-M) & h(N-2M) & & \\ & & \vdots & h(N-M) & & \\ & & & \vdots & & \end{bmatrix}$$

$H^*_p$ is the delayed version of the pth phase of an M-phase polyphase decomposition of the original filter H. For example:

$$H^*_2 = \begin{bmatrix} & \vdots & & & \\ & h(N-3M+2) & \vdots & & \\ & h(N-2M+2) & h(N-3M+2) & \vdots & \\ & h(N-M+2) & h(N-2M+2) & h(N-3M+2) & \\ \ldots & h(2) & h(N-M+2) & h(N-2M+2) & \ldots \\ & h(M+2) & h(2) & h(N-M+2) & \\ & h(2M+2) & h(M+2) & h(2) & \\ & \vdots & h(2M+2) & h(M+2) & \\ & h(N-2M+2) & \vdots & h(2M+2) & \\ & \vdots & h(N-2M) & \vdots & \\ & & \vdots & h(N-2M) & \\ & & & \vdots & \end{bmatrix}$$

The $\tilde{H}$ matrix includes subfilter matrices (derived from polyphase decomposition) and the indices of the subfilter matrices have a regular structure and can be created by the following algorithm:

$\hat{H} = \text{toeplitz}(H_{[0:1:M-1]}, H^*_{[M:-1):1]})$.

And $\tilde{H} = \hat{H}(:,1:f:end)$

Where f is the interpolation factor and M is the number of outputs phases.

For example, the $\tilde{H}$ filter for a 4-to-8 interpolator is:

$$\hat{H} = \begin{bmatrix} H_0 & H^*_7 & H^*_6 & H^*_5 & H^*_4 & H^*_3 & H^*_2 & H^*_1 \\ H_1 & H_0 & H^*_7 & H^*_6 & H^*_5 & H^*_4 & H^*_3 & H^*_2 \\ H_2 & H_1 & H_0 & H^*_7 & H^*_6 & H^*_5 & H^*_4 & H^*_3 \\ H_3 & H_2 & H_1 & H_0 & H^*_7 & H^*_6 & H^*_5 & H^*_4 \\ H_4 & H_3 & H_2 & H_1 & H_0 & H^*_7 & H^*_6 & H^*_5 \\ H_5 & H_4 & H_3 & H_2 & H_1 & H_0 & H^*_7 & H^*_6 \\ H_6 & H_5 & H_4 & H_3 & H_2 & H_1 & H_0 & H^*_7 \\ H_7 & H_6 & H_5 & H_4 & H_3 & H_2 & H_1 & H_0 \end{bmatrix}$$

$$\tilde{H} = \begin{bmatrix} H_0 & H^*_6 & H^*_4 & H^*_2 \\ H_1 & H^*_7 & H^*_5 & H^*_3 \\ H_2 & H_0 & H^*_6 & H^*_4 \\ H_3 & H_1 & H^*_7 & H^*_5 \\ H_4 & H_2 & H_0 & H^*_6 \\ H_5 & H_3 & H_1 & H^*_7 \\ H_6 & H_4 & H_2 & H_0 \\ H_7 & H_5 & H_3 & H_1 \end{bmatrix}$$

Also, the output phases can be computed by:

$$\begin{bmatrix} y_0 \\ y_1 \\ y_2 \\ y_3 \\ y_4 \\ y_5 \\ y_6 \\ y_7 \end{bmatrix} = \tilde{H} \cdot \begin{bmatrix} x_0 \\ x_1 \\ x_2 \\ x_3 \end{bmatrix} = \begin{bmatrix} H_0 & H^*_6 & H^*_4 & H^*_2 \\ H_1 & H^*_7 & H^*_5 & H^*_3 \\ H_2 & H_0 & H^*_6 & H^*_4 \\ H_3 & H_1 & H^*_7 & H^*_5 \\ H_4 & H_2 & H_0 & H^*_6 \\ H_5 & H_3 & H_1 & H^*_7 \\ H_6 & H_4 & H_2 & H_0 \\ H_7 & H_5 & H_3 & H_1 \end{bmatrix} \cdot \begin{bmatrix} x_0 \\ x_1 \\ x_2 \\ x_3 \end{bmatrix}$$

As an example, the first output phase can be computed by the following:

$\underline{y_0} = H_0 \underline{x_0} + H^*_6 \underline{x_1} + H^*_4 \underline{x_2} + H^*_2 \underline{x_3}$ where:

$$H_0 \underline{x_0} = \begin{bmatrix} \vdots \\ h\left(\frac{N-1}{8}\right) & \vdots \\ & h(0) & h\left(\frac{N-1}{8}\right) & \vdots \\ \ldots & h(8) & h(0) & h\left(\frac{N-1}{8}\right) & \ldots \\ & h(16) & h(8) & h(0) \\ & \vdots & h(16) & h(8) \\ & h\left(\frac{N-1}{8}\right) & \vdots & h(16) \\ & & h\left(\frac{N-1}{8}\right) & \vdots \\ & & & h\left(\frac{N-1}{8}\right) \\ & & & \vdots \end{bmatrix} \cdot \begin{bmatrix} \vdots \\ x(i-8) \\ x(i-4) \\ x(i) \\ x(i+4) \\ x(i+8) \\ \vdots \end{bmatrix}$$

The invention also applies to interpolation filters with interpolation factors greater than 2. For example, a interpolate-by-3 filter can be implemented as a 3-to-9 phase interpolator:

$$\begin{bmatrix} y_0 \\ y_1 \\ y_2 \\ y_3 \\ y_4 \\ y_5 \\ y_6 \\ y_7 \\ y_8 \end{bmatrix} = \begin{bmatrix} H_0 & H_6^* & H_3^* \\ H_1 & H_7^* & H_4^* \\ H_2 & H_8^* & H_5^* \\ H_3 & H_0 & H_6^* \\ H_4 & H_1 & H_7^* \\ H_5 & H_2 & H_8^* \\ H_6 & H_3 & H_0 \\ H_7 & H_4 & H_1 \\ H_8 & H_5 & H_2 \end{bmatrix} \cdot \begin{bmatrix} x_0 \\ x_1 \\ x_2 \end{bmatrix}$$

From the foregoing, one can derive the following applications:

1. Single-rate filtering (n phases in and n phases out) at rates above the device rate:

$$\hat{H} = \text{toeplitz}(H_{[0:1:n-1]}, H_{[n:(-1):1]}^*);$$

$$\underline{y} = \hat{H} * \underline{x};$$

For example: 4 phases in and 4 phases out:

$$\begin{bmatrix} y_0 \\ y_1 \\ y_2 \\ y_3 \end{bmatrix} = \begin{bmatrix} H_0 & H_3^* & H_2^* & H_1^* \\ H_1 & H_0 & H_3^* & H_2^* \\ H_2 & H_1 & H_0 & H_3^* \\ H_3 & H_2 & H_1 & H_0 \end{bmatrix} \cdot \begin{bmatrix} x_0 \\ x_1 \\ x_2 \\ x_3 \end{bmatrix}$$

2. Decimation filtering ($\downarrow$M: n phases in and n/M phases out):

$$\hat{H} = \text{toeplitz}(H_{[0:1:n-1]}, H_{[n:(-1):1]}^*);$$

$$\underline{y} = \hat{H}(1:M:\text{end},:) * \underline{x};$$

For example: 4 phases in and 2 phases out (decimate-by-2):

$$\begin{bmatrix} y_0 \\ y_1 \end{bmatrix} = \begin{bmatrix} H_0 & H_3^* & H_2^* & H_1^* \\ H_2 & H_1 & H_0 & H_3^* \end{bmatrix} \cdot \begin{bmatrix} x_0 \\ x_1 \\ x_2 \\ x_3 \end{bmatrix}$$

3. Interpolation filtering ($\uparrow$M: n phases in and nM phases out):

$$\hat{H} = \text{toeplitz}(H_{[0:1:nM-1]}, H_{[nM:(-1):1]}^*);$$

$$\underline{y} = \hat{H}(:,1:M:\text{end}) * \underline{x};$$

For example: 2 phases in and 4 phases out (interpolate-by-2):

$$\begin{bmatrix} y_0 \\ y_1 \\ y_2 \\ y_3 \end{bmatrix} = \begin{bmatrix} H_0 & H_2^* \\ H_1 & H_3^* \\ H_2 & H_0 \\ H_3 & H_1 \end{bmatrix} \cdot \begin{bmatrix} x_0 \\ x_1 \end{bmatrix}$$

4. Fractional filtering ($\uparrow$M/N: n phase in and nM/N phases out):

For example: 4 phase input→decimate-by-2→interpolate by 3→6 phase output $$\begin{bmatrix} y_0 \\ y_1 \\ y_2 \\ y_3 \\ y_4 \\ y_5 \end{bmatrix} = \begin{bmatrix} H_{I0} & H_{I3} \\ H_{I1} & H_{I4} \\ H_{I2} & H_{I5} \\ H_{I3} & H_{I0} \\ H_{I4} & H_{I1} \\ H_{I5} & H_{I2} \end{bmatrix} \cdot \begin{bmatrix} H_{D0} & H_{D3}^* & H_{D2}^* & H_{D1}^* \\ H_{D2} & H_{D1} & H_{D0} & H_{D3}^* \end{bmatrix} \cdot \begin{bmatrix} x_0 \\ x_1 \\ x_2 \\ x_3 \end{bmatrix}$$

Figure 8:
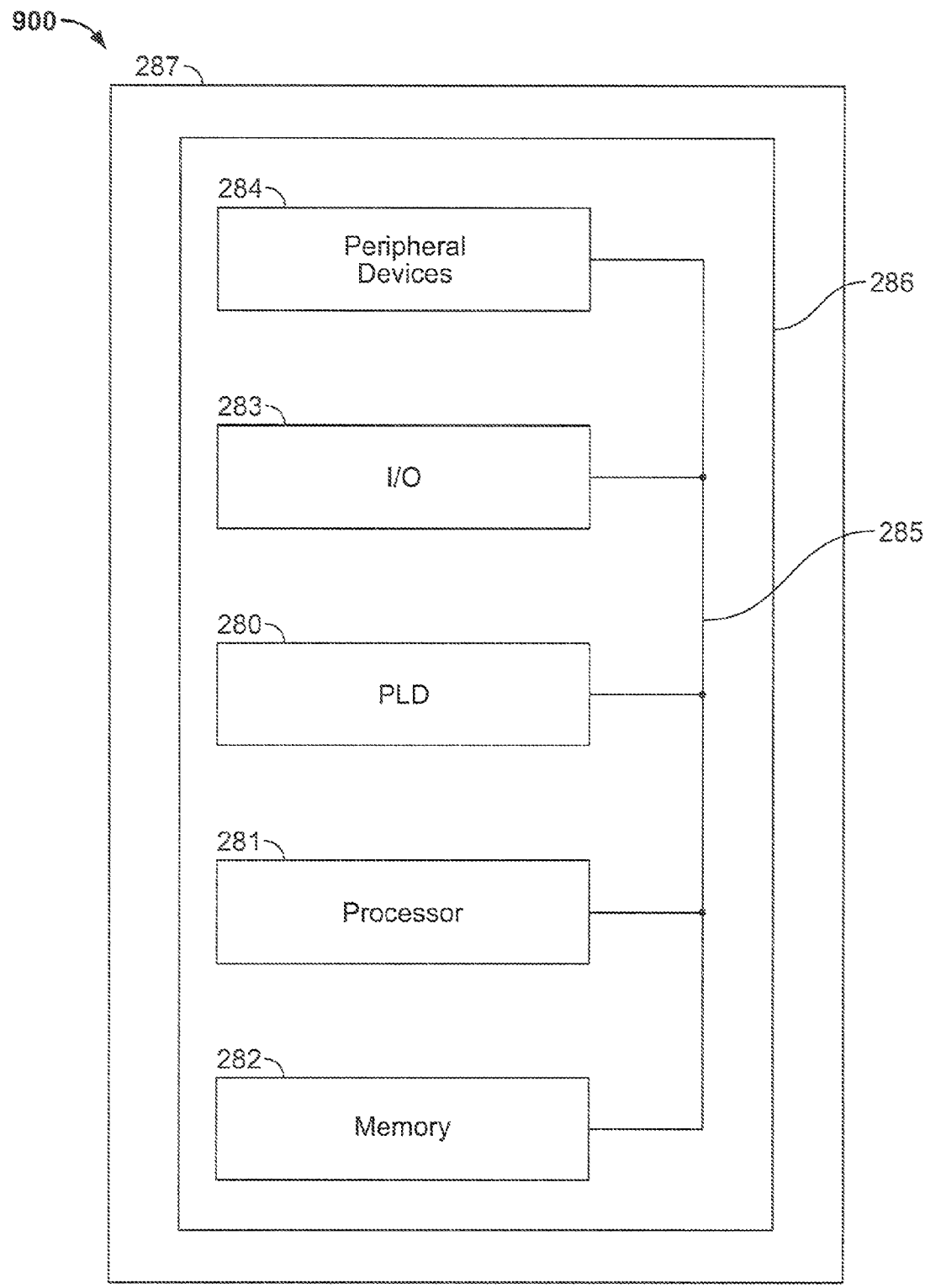
FIG. 8 is a simplified block diagram of an illustrative system employing a programmable logic device incorporating the present invention.

A PLD 280 configured according to the present invention may be used in many kinds of electronic devices. One possible use is in a data processing system 900 shown in FIG. 8. Data processing system 900 may include one or more of the following components: a processor 281; memory 282; I/O circuitry 283; and peripheral devices 284. These components are coupled together by a system bus 285 and are populated on a circuit board 286 which is contained in an end-user system 287.

System 900 can be used in a wide variety of applications, such as computer networking, data networking, instrumentation, video processing, digital signal processing, or any other application where the advantage of using programmable or reprogrammable logic is desirable. PLD 280 can be used to perform a variety of different logic functions. For example, PLD 280 can be configured as a processor or controller that works in cooperation with processor 281. PLD 280 may also be used as an arbiter for arbitrating access to a shared resources in system 900. In yet another example, PLD 280 can be configured as an interface between processor 281 and one of the other components in system 900. It should be noted that system 900 is only exemplary, and that the true scope and spirit of the invention should be indicated by the following claims.

Various technologies can be used to implement PLDs 280 as described above and incorporating this invention.

Instructions for carrying out the method according to this invention may be encoded on a machine-readable medium, to be executed by a suitable computer or similar device to implement the method of the invention for programming PLDs. For example, a personal computer may be equipped with an interface to which a PLD can be connected, and the personal computer can be used by a user to program the PLD using a suitable software tool, such as the QUARTUS® II software available from Altera Corporation, of San Jose, Calif.

Figure 9:
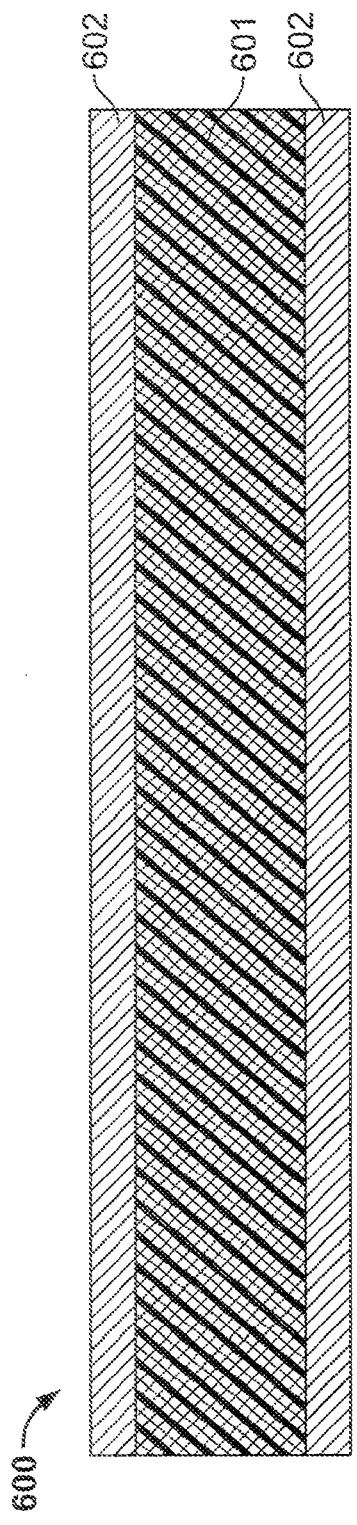
FIG. 9 is a cross-sectional view of a magnetic data storage medium encoded with a set of machine-executable instructions for performing the method according to the present invention.

FIG. 9 presents a cross section of a magnetic data storage medium 600 which can be encoded with a machine executable program that can be carried out by systems such as the aforementioned personal computer, or other computer or similar device. Medium 600 can be a floppy diskette or hard disk, or magnetic tape, having a suitable substrate 601, which may be conventional, and a suitable coating 602, which may be conventional, on one or both sides, containing magnetic domains (not visible) whose polarity or orientation can be altered magnetically. Except in the case where it is magnetic tape, medium 600 may also have an opening (not shown) for receiving the spindle of a disk drive or other data storage device.

The magnetic domains of coating 602 of medium 600 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, as a filter in accordance with the invention.

Figure 10:
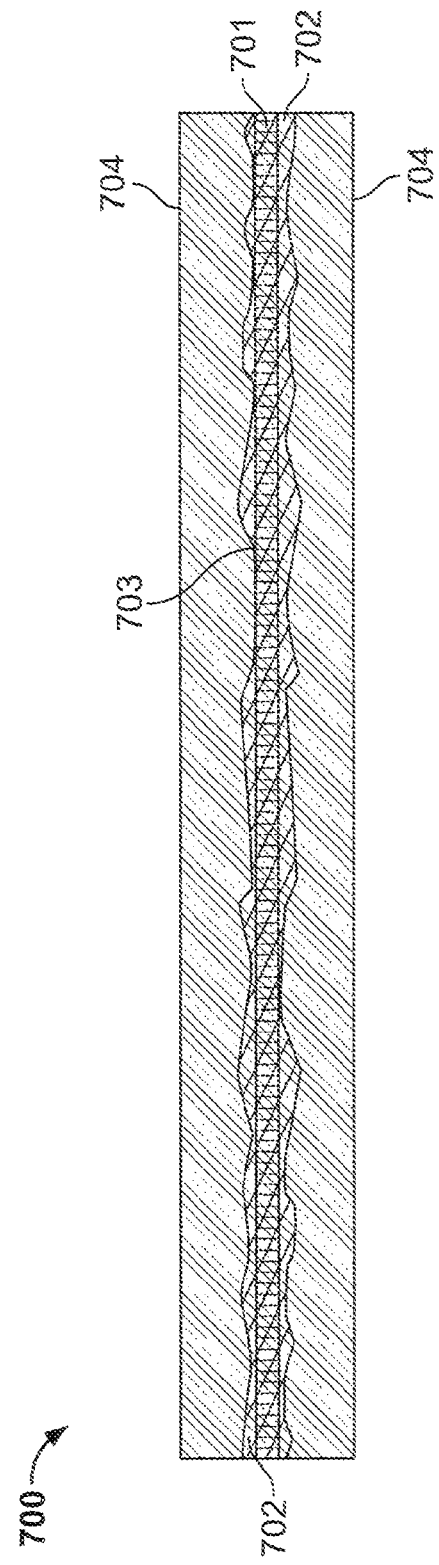
FIG. 10 is a cross-sectional view of an optically readable data storage medium encoded with a set of machine executable instructions for performing the method according to the present invention.

FIG. 10 shows a cross section of an optically-readable data storage medium 700 which also can be encoded with such a machine-executable program, which can be carried out by systems such as the aforementioned personal computer, or other computer or similar device. Medium 700 can be a conventional compact disk read only memory (CD-ROM) or digital video disk read only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 700 preferably has a suitable substrate 701, which may be conventional, and a suitable coating 702, which may be conventional, usually on one or both sides of substrate 701.

In the case of a CD-based or DVD-based medium, as is well known, coating 702 is reflective and is impressed with a plurality of pits 703, arranged on one or more layers, to encode the machine-executable program. The arrangement of pits is read by reflecting laser light off the surface of coating 702. A protective coating 704, which preferably is substantially transparent, is provided on top of coating 702.

In the case of magneto-optical disk, as is well known, coating 702 has no pits 703, but has a plurality of magnetic domains whose polarity or orientation can be changed magnetically when heated above a certain temperature, as by a laser (not shown). The orientation of the domains can be read by measuring the polarization of laser light reflected from coating 702. The arrangement of the domains encodes the program as described above.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A FIR (Finite Impulse Response) filter structure on an integrated circuit device, for processing data samples and a set of coefficients, at an effective filter data rate that exceeds an input/output data rate by a factor, said FIR filter structure comprising:

a plurality of FIR filter stages including at a least an initial filter stage and a final filter stage, each of said filter stages having one or more subfilters defined by a subset of said set of coefficients, a first one of said initial and final filter stages having a number of subfilters that exceeds a number of subfilters in a second of said initial and final filter stages by said factor; wherein:

each subfilter in each respective filter stage convolves input data with a respective subset of said set of coefficients; and in at least one particular stage, at least a first subfilter in said particular stage includes a plurality of decomposed filters in a first filter order representing said respective subset of said set of coefficients in a first coefficient order, and at least a second subfilter in said particular stage includes said plurality of decomposed filters in a second filter order, different from said first filter order, representing said respective subset of said set of coefficients in a second coefficient order different from said first coefficient order.

2. The filter structure of claim 1 wherein:
said filter structure is an interpolation filter;
said first one of said initial and final filter stages is said final filter stage;
said effective filter data rate is an output rate; and
said input/output data rate is an input data rate.

3. The filter structure of claim 1 wherein:
said filter structure is a decimation filter;
said first one of said initial and final filter stages is said initial filter stage;
said effective filter data rate is an input rate; and
said input/output data rate is an output data rate.

4. The FIR filter structure of claim 1 further comprising at least one intermediate filter stage.

5. The FIR filter structure of claim 1 wherein:
said integrated circuit device has a maximum device data rate; and
said effective filter data rate exceeds said maximum device data rate.

6. The filter structure of claim 1 wherein a particular one of said decomposed filters in said at least a first subfilter is delayed relative to said particular one of said decomposed filters in said at least a second subfilter.

7. A method of programmably configuring a programmable integrated circuit device, having a maximum device data rate, as a FIR (Finite Impulse Response) filter structure, for processing data samples and a set of a number of coefficients, at an effective filter data rate that exceeds an input/output data rate by a factor, said method comprising:

programmably configuring logic of said programmable integrated circuit device as a plurality of FIR filter stages including at a least an initial filter stage and a final filter stage, each of said filter stages having one or more subfilters defined by a subset of said set of coefficients, a first one of said initial and final filter stages having a number of subfilters that exceeds a number of subfilters in a second of said initial and final filter stages by said factor;

programmably configuring each subfilter in each respective filter stage to convolve input data with a respective subset of said set of coefficients; and programmably configuring, in at least one particular stage, at least a first subfilter in said particular stage to include a plurality of decomposed filters in a first filter order representing said respective subset of said set of coefficients in a first coefficient order, and at least a second subfilter in said particular stage to include said plurality of decomposed filters in a second filter order, different from said first filter order representing said respective subset of said set of coefficients in a second coefficient order.

8. The method of claim 7 wherein said filter structure is an interpolation filter;
said first one of said initial and final filter stages is said final filter stage;
said effective filter data rate is an output rate; and
said input/output data rate is an input data rate.

9. The method of claim 7 wherein said filter structure is a decimation filter;
said first one of said initial and final filter stages is said initial filter stage;
said effective filter data rate is an input rate; and
said input/output data rate is an output data rate.

10. The method of claim 7 further comprising programmably configuring logic of said programmable integrated circuit device as at least one intermediate filter stage.

11. The method of claim 7 wherein:
said effective filter data rate exceeds said maximum device data rate.

12. The method of claim 7 further comprising programmably configuring a particular one of said decomposed filters in said at least a first subfilter to be delayed relative to said particular one of said decomposed filters in said at least a second subfilter.

13. A non-transitory machine-readable data storage medium encoded with machine-executable instructions for performing a method of programmably configuring a programmable integrated circuit device, having a maximum device data rate, as a FIR (Finite Impulse Response) filter structure, for processing data samples and a set of a number of coefficients, at an effective filter data rate that exceeds an input/output data rate by a factor, said instructions comprising:
instructions for programmably configuring logic of said programmable integrated circuit device as a plurality of FIR filter stages including at a least an initial filter stage and a final filter stage, each of said filter stages having one or more subfilters defined by a subset of said set of coefficients, a first one of said initial and final filter stages having a number of subfilters that exceeds a number of subfilters in a second of said initial and final filter stages by said factor;
instructions for programmably configuring each subfilter in each respective filter stage to convolve input data with a respective subset of said set of coefficients; and
instructions for programmably configuring, in at least one particular stage, at least a first subfilter in said particular stage to include a plurality of decomposed filters in a first filter order representing said respective subset of said set of coefficients in a first coefficient order, and at least a second subfilter in said particular stage to include said plurality of decomposed filters in a second filter order, different from said first filter order representing said respective subset of said set of coefficients in a second coefficient order.

14. The non-transitory machine-readable data storage medium of claim 13 wherein said instructions comprise instructions to configure said filter structure as an interpolation filter in which:
said first one of said initial and final filter stages is said final filter stage;
said effective filter data rate is an output rate; and
said input/output data rate is an input data rate.

15. The non-transitory machine-readable data storage medium of claim 13 wherein said instructions comprise instructions to configure said initial filter stage said filter structure as a decimation filter in which:
said first one of said initial and final filter stages is said initial filter stage;
said effective filter data rate is an input rate; and
said input/output data rate is an output data rate.

16. The non-transitory machine-readable data storage medium of claim 13 wherein said instructions comprise instructions to configure said filter such that said effective filter data rate exceeds said maximum device data rate.

17. The non-transitory machine-readable data storage medium of claim 13 further comprising instructions for programmably configuring a particular one of said decomposed filters in said at least a first subfilter to be delayed relative to said particular one of said decomposed filters in said at least a second subfilter.

* * * * *